US007192683B2

(12) United States Patent
Yamasaki et al.

(10) Patent No.: US 7,192,683 B2
(45) Date of Patent: Mar. 20, 2007

(54) PLANOGRAPHIC PRINTING PLATE PRECURSOR

(75) Inventors: Sumiaki Yamasaki, Shizuoka-ken (JP); Hiroshi Tashiro, Shizuoka-ken (JP)

(73) Assignee: Fuji Photo Film Co., Ltd, Kanagawa (JP)

( * ) Notice: Subject to any disclaimer, the term of this patent is extended or adjusted under 35 U.S.C. 154(b) by 0 days.

(21) Appl. No.: 10/654,047

(22) Filed: Sep. 4, 2003

(65) Prior Publication Data

US 2004/0060465 A1 Apr. 1, 2004

(30) Foreign Application Priority Data

Sep. 5, 2002 (JP) ............................ 2002-259949
Sep. 5, 2002 (JP) ............................ 2002-259950

(51) Int. Cl.
*G03F 7/038* (2006.01)

(52) U.S. Cl. ................ 430/270.1; 430/138; 430/273.1; 430/281.1

(58) Field of Classification Search ................ 430/138, 430/270.1, 273.1, 281.1, 494, 944, 945
See application file for complete search history.

(56) References Cited

U.S. PATENT DOCUMENTS

| | | | | |
|---|---|---|---|---|
| 2,991,204 | A | 7/1961 | Astle | |
| 5,948,599 | A | 9/1999 | Gardner et al. | |
| 5,962,188 | A | 10/1999 | DeBoer et al. | |
| 6,014,930 | A | 1/2000 | Burberry et al. | |
| 6,672,210 | B2 | 1/2004 | Kawamura et al. | |
| 6,730,456 | B2 * | 5/2004 | Takahashi et al. | 430/138 |
| 6,794,104 | B2 * | 9/2004 | Tashiro | 430/138 |
| 6,919,163 | B2 * | 7/2005 | Oohashi et al. | 430/273.1 |
| 6,936,399 | B2 * | 8/2005 | Yamasaki et al. | 430/270.1 |
| 6,977,132 | B2 * | 12/2005 | Yamasaki et al. | 430/270.1 |
| 2002/0023565 | A1 | 2/2002 | Kawamura et al. | |
| 2002/0134266 | A1 | 9/2002 | Yamasaki et al. | |
| 2003/0118849 | A1 | 6/2003 | Yamasaki et al. | |
| 2003/0143407 | A1 | 7/2003 | Yamasaki et al. | |
| 2003/0170566 | A1 | 9/2003 | Yamasaki et al. | |
| 2003/0186057 | A1 | 10/2003 | Oohashi et al. | |
| 2004/0060465 | A1 | 4/2004 | Yamasaki et al. | |
| 2005/0158658 | A1 * | 7/2005 | Yamasaki et al. | 430/270.1 |

FOREIGN PATENT DOCUMENTS

| | | | | |
|---|---|---|---|---|
| EP | 0 619 525 | A1 | | 10/1994 |
| EP | 0 709 228 | A1 | | 5/1996 |
| EP | 0 903 224 | A2 | | 3/1999 |
| EP | 0 938 972 | A1 | | 9/1999 |
| EP | 0 949 088 | A1 | | 10/1999 |
| EP | 1 052 113 | A | | 11/2000 |
| EP | 1 057 622 | A2 | | 12/2000 |
| EP | 1 088 679 | A2 | | 4/2001 |
| EP | 1 172 696 | A1 | | 1/2002 |
| EP | 1 211 096 | A1 | | 6/2002 |
| EP | 1 226 976 | A1 | | 7/2002 |
| JP | 59-101651 | A | | 6/1984 |
| JP | 7-1853 | A | | 1/1995 |
| JP | 8-507727 | A | | 8/1996 |
| JP | 08-272087 | A | | 10/1996 |
| JP | 8-292558 | A | | 11/1996 |
| JP | 2001-213062 | A | | 8/2001 |
| JP | 2001-315452 | A | | 11/2001 |
| JP | 2002-154280 | | | 5/2002 |
| JP | 2002-166672 | | | 6/2002 |
| JP | 2003-175683 | | * | 6/2003 |
| WO | WO 94/23954 | A1 | | 10/1994 |
| WO | WO 96/29375 | A1 | | 9/1996 |

OTHER PUBLICATIONS

Chuichi Hirayama et al., "Lipid Membrane Analogues, Specific Retention Behavior in Comb-Shaped Telomer-Immobilized Porous Silica Gels", Marcromolecules 1992, vol. 25, 6375-6376.

Partial European Search Report dated Jun. 27, 2005.

Cleaning Buildings Using Rain as a Shower; The Chemical Daily, Jan. 30, 1995, p. 1.

Japanese Office Action (with English translation) dated Jun. 27, 2006 issued in Japanese Application No. 2002-259950.

* cited by examiner

*Primary Examiner*—Barbara L. Gilliam
(74) *Attorney, Agent, or Firm*—Sughrue Mion, PLLC

(57) ABSTRACT

The planographic printing plate precursor of the present invention comprises a support, and a hydrophilic layer disposed on the support and having a hydrophilic graft chain and a crosslinked structure formed by hydrolyzing or polycondensing an alkoxide of an element selected from Si, Ti, Zr and Al, wherein the hydrophilic layer comprises a photothermal conversion agent (A) and a compound (B) capable of forming a hydrophobic surface area by being heated or irradiated with radiation, and the photothermal conversion compound (A) is not included in the compound (B). This planographic printing plate precursor can be set, without being developed, onto a printer after images are formed, so as to perform printing. In addition, the precursor has remarkably improved printing stain resistance and printing resistance.

15 Claims, No Drawings

PLANOGRAPHIC PRINTING PLATE PRECURSOR

CROSS-REFERENCE TO RELATED APPLICATION

This application claims priority under 35 USC 119 from Japanese patent application Nos. 2002-259949 and 2002-259950, the disclosures of which are incorporated by reference herein.

BACKGROUND OF THE INVENTION

1. Field of the Invention

The present invention relates to a novel planographic printing plate precursor, and more specifically, a planographic printing plate precursor which can be imagewise scanning-exposed by a laser ray based on digital signals and which has superior sensitivity and stain resistance.

2. Description of the Related Art

Planography is a printing method using a plate member having a lipophilic area which receives ink and an ink-repelling area (hydrophilic area) which does not receive ink but receives moistening water. At present, photosensitive planographic printing plate precursors (PS plates) have been widely used in planography.

As one of the PS plates, a plate wherein a photosensitive layer is formed on a support such as an aluminum plate has been practicable and widely used. Such a PS plate is imagewise exposed to light and developed to remove the photosensitive layer at a non-image portion, and printing is performed by utilizing the hydrophilicity of the support surface and the lipophilicity of the photosensitive layer at an image portion. In such a plate member, the support surface needs to be highly hydrophilic in order to prevent staining of the non-image portion.

Conventionally, the hydrophilic support or the hydrophilic layer used in planographic printing plate precursors are generally anodized aluminum supports or anodized aluminum supports treated with silicate to further improve the hydrophilicity thereof. Furthermore, research on hydrophilic supports or hydrophilic layers using such aluminum supports have been actively made. A support treated with an undercoat agent made of polyvinyl phosphonic acid and a technique using a polymer having a sulfonic acid group as an undercoat layer for a photosensitive layer, are known. Moreover, a technique using polyvinyl benzoic acid or the like as the undercoat layer has also been suggested.

With regards to a hydrophilic layer in the case of not using a metal support such as an aluminum support but using a flexible support such as a PET (polyethylene terephthalate) support or a cellulose acetate support, the following techniques are known: a technique of forming, on a PET support, a hydrophilic layer which contains a hydrophilic polymer and is cured with hydrolyzed tetraalkyl orthosilicate (see, for example, Patent document 1 (Japanese Patent Application Laid-Open (JP-A) No. 8-272087)), and a technique of forming a hydrophilic layer having a phase-separation structure composed of two phases, namely, a phase with of a hydrophilic polymer as a main component and a phase with a hydrophobic polymer as a main component (see, for example, Patent document 2 (JP-A No. 8-292558)), and other techniques.

These hydrophilic layers have higher hydrophilicity than conventional hydrophilic layers, and provide planographic printing plates capable of supplying printed matters having no stains at an initial stage of printing operations. However, when printing is repeated, problems, such as the hydrophilic layers peeling or the hydrophilicity thereof decreasing with the passage of time, occur. Thus, it has been desired to develop planographic printing plate precursors which are able, even under more harsh printing conditions, to supply a great number of printed matters having no stains, without hydrophilic layers of the planographic printing plates being peeled from their supports or the hydrophilicity of their surfaces being lowered. From a practical viewpoint, it is required to improve the hydrophilicity still more in the present situation.

With regards to printing plates for computer-to-plate systems, which have been remarkably progressed in recent years, much research has been made. In particular, development-free planographic printing plate precursors, which are set to a printing machine for printing without being developed after being exposed to light, have been researched in order to make printing-processing more efficient and solve the problem of waste liquid disposal. As a result, various methods have been suggested.

One of the methods for removing the disposal step is a method called on-machine development, which comprises a step of fitting an exposed printing precursor to a cylinder of a printing machine; and a step of supplying moistening water and ink thereto while rotating the cylinder, thereby removing the non-image portion of the printing precursor. That is, this is a method of exposing the printing precursor to light; then setting the plate, as it is, to a printing machine; and completing development in the course of an ordinary printing process.

It is necessary that a planographic printing plate precursor suitable for such on-machine development has a photosensitive layer soluble in moistening water and ink solvent and further has good bright-room-handling performance suitable for being developed on a printing machine located in a bright room.

As a printing plate precursor for which no developing step is necessary, there is known a non-processed printing plate precursor in which a crosslinked hydrophilic layer is formed on a support, the crosslinked layer containing microencapsulated heat-meltable material (see, for example, Patent document 3 (WO No. 94/23954 pamphlet)). In this printing plate precursor, the microcapsules collapse by the action of heat generated in the area exposed to a laser and then lipophilic material in the capsules is melted out so that the surface of the hydrophilic layer is made hydrophobic. This printing plate precursor does not need to be developed, but the hydrophilicity or the durability of the hydrophilic layer deposited on the support is insufficient, thereby resulting in a problem wherein, as printing using the plate is repeated, the non-image portions in printed matters gradually become more stained.

SUMMARY OF THE INVENTION

An object of the present invention, which has been made to solve the above-mentioned various problems, is to provide a negative planographic printing plate precursor provided with a hydrophilic layer having high hydrophilicity and superior durability, thereby having particularly superior print stain resistance and printing resistance.

Another object of the invention is to provide a planographic printing plate precursor capable of being processed by scanning exposure based on digital signals, and capable of being processed through easy water-development operation after an image is formed, or capable of being set on a printing machine without being subjected to especial development for printing.

In order to attain the above-mentioned objects, the inventors made researches. As a result, it has been found out that the above-mentioned problems can be solved by incorporating a photothermal conversion agent and a compound capable of forming a hydrophobic surface area, each independently, into a hydrophilic layer having a crosslinked structure made of an organic/inorganic composite comprising a specific hydrophilic polymer. Thus, a first aspect of the invention has been made.

That is, the first aspect of the invention is a planographic printing plate precursor comprising a support, and a hydrophilic layer which is formed on or over the support, which has a hydrophilic graft chain and which further has a crosslinked structure formed by hydrolyzing or polycondensing an alkoxide of an element selected from Si, Ti, Zr and Al, wherein the hydrophilic layer comprises a photothermal conversion agent (A) and a compound (B) capable of forming a hydrophobic surface area by being heated or irradiated with a radiation, and the photothermal conversion compound (A) is not included in the compound (B).

Such a hydrophilic layer which has a hydrophilic graft chain and further has a crosslinked structure formed by hydrolyzing or polycondensing an alkoxide of an element selected from Si, Ti, Zr and Al preferably comprises a hydrophilic polymer compound represented by the following general formula (1):

General formula (1)

(i)

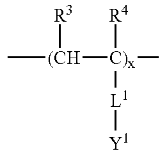

(ii)

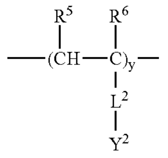

(iii)

$(R^1)_m(OR^2)_{3-m}$—Si—$L^3$—

The hydrophilic polymer compound represented by the general formula (1) is a polymer compound having a silane coupling group represented by a structural unit (iii) at a terminal of a polymer unit or polymer units represented by a structural unit (i) and/or a structural unit (ii). In the formula (1), $R^1$, $R^2$, $R^3$, $R^4$, $R^5$ and $R^6$ each independently represent a hydrogen atom or a hydrocarbon group having 1 to 8 carbon atoms, m is 0, 1 or 2, n is an integer of 1 to 8, x and y are values satisfying x+y=100 and the ratio of x:y is in a range from 100:0 to 1:99. $L^1$, $L^2$ and $L^3$ each independently represent a single bond or an organic linking group, and $Y^1$ and $Y^2$ each independently represent —$N(R^7)(R^8)$, —OH, —$NHCOR^7$, —$COR^7$, —$CO_2M$ or —$SO_3M$ wherein $R^7$ and $R^8$ each independently represent a hydrogen atom or an alkyl group having 1 to 8 carbon atoms and M represents a hydrogen atom, alkali metal, alkali earth metal or onium.

More specifically, the aforementioned hydrophilic polymer, contained in the hydrophilic layer, includes a polymer unit represented by the structural unit (i) and optionally a polymer unit represented by the structural unit (ii) of the general formula (1), the hydrophilic polymer further including a silane coupling group represented by the structural unit (iii) of the formula (1) at a terminal of the polymer unit.

The hydrophilic layer according to the present aspect can be formed by preparing a hydrophilic coating-solution composition comprising a hydrophilic polymer compound represented by the general formula (1) and preferably comprising a crosslinking component represented by the following general formula (2), applying the composition onto a support surface, and drying the applied composition.

$$(R^7)_m—X—(OR^8)_{4-m} \quad \text{General Formula (2)}$$

Wherein $R^7$ and $R^8$ each independently represent an alkyl group or an aryl group, X represents Si, Al, Ti or Zr, and m is an integer of 0 to 2.

The mechanism which causes the effect of the present aspect of the invention is not clear, but can be considered as follows: in the hydrophilic layer which is formed on or over a support, has a hydrophilic graft chain and further has a crosslinked structure formed by hydrolyzing or polycondensing an alkoxide of an element selected from Si, Ti, Zr and Al, hydrophilic functional groups introduced in the state of the graft chain are preferentially present at the surface of the hydrophilic layer and are in a free state, and further an organic/inorganic composite coating having a highly-dense crosslinked structure is formed by the hydrolysis or the polycondensation of the metal alkoxide; therefore, the hydrophilic layer becomes a film having high hydrophilicity and high strength.

Specifically, the above-mentioned effect can be presumed as follows: when a hydrophilic coating-solution composition comprising a hydrophilic polymer compound represented by the general formula (1) is prepared and applied to form a hydrophilic layer, the hydrophilic layer has a crosslinked structure of Si(OR)4 formed by interaction between silane coupling groups of the hydrophilic polymer compound; therefore, a high printing resistance can be realized by the firm crosslinked structure; and further a moiety having a hydrophilic group in the hydrophilic polymer compound is positioned at the other terminal of the linear main chain; therefore, the moiety has high mobility so that supply and discharge rates of moistening water supplied or discharged at the time of printing are high, whereby stains in the non-image portions are effectively suppressed by the high hydrophilicity and thus high-quality images can be formed. By the addition of the crosslinking component represented by the general formula (2) to the hydrophilic coating-solution composition, the interaction between the silane coupling group and the crosslinking component causes the density of the crosslinked structure to be higher. Based on such more improvement on the strength of the film, higher printing resistance can be expected.

Furthermore, in the present aspect, a photothermal conversion agent and a compound capable of forming a hydrophobic surface area are incorporated into the hydrophilic layer, whereby in the matrix made of the hydrophilic polymer compound, particles of the surface hydrophilic area formable compound, such as thermally meltable hydrophobic particles, are melted and adhered to each other in a heated area or a radiation irradiated area. As a result, a hydrophobic area is formed so that an image can be formed by scanning exposure to a laser ray or the like for a short time. The original hydrophilic layer thus functions as an image-forming layer.

At this time, the photothermal conversion agent is not included (encapsulated) in the hydrophobic surface area formable compound and the agent and the compound are each independently dispersed in the hydrophilic surface; therefore, the infrared absorbing agent and the hydrophobic surface area formable compound are not excessively close to each other. Thus, even if heat is generated at a very high temperature near the photothermal conversion agent by laser exposure of a high exposure quantity, a hydrophobic area is reliably formed without the hydrophobic surface area formable compound being decomposed by the heat. As a result, the thus formed hydrophobic area does not contain any low molecular weight compound, which results from thermal decomposition, and the hydrophobic area is made firm and strong. Accordingly, the generation of image portion defects due to elimination of any hydrophobic component during printing is suppressed, and higher printing resistance can be expected.

Furthermore, since the non-image portions keep superior hydrophilicity by the hydrophilic layer having such a high film strength as describe above, the precursor according to the first aspect can be processed through easy water development operation, or can be directly set onto a printing machine and processed without requiring any development process.

The inventors made further researches, and as a result, it has been found out that the above-mentioned objects can be attained by incorporating specific water-dispersible particles into a hydrophilic layer on or over a support, which constitutes a second aspect of the invention.

Specifically, the second aspect of the invention is a planographic printing plate precursor comprising a support, and a hydrophilic layer which is formed on or over the support and contains water-dispersible particles that can be yielded by copolymerization of a hydrophilic macro-monomer and a hydrophobic monomer and are capable of forming a hydrophobic surface area by being heated or irradiated with a radiation (the particles being hereinafter referred to as "specific water-dispersible particles" according to circumstances).

The specific water-dispersible particles according to the invention are particles of a copolymer of a hydrophilic macro-monomer and a hydrophobic monomer, and has a shape as follows: hydrophilic macro-monomer chains are bonded with each other in a radiant form (in a corona form), to form the outer side of the particle; and, the hydrophobic monomer is polymerized to form a nuclei (i.e., a core) at the inner side of the particle. Accordingly, the surface of the specific water-dispersible particle in the aforementioned state exhibits hydrophilicity. A particle having such a shape is called a "core-corona type particle" in the invention.

By heating the hydrophilic layer comprising such specific water-dispersible particles or radiating a radiation onto the layer, the structure of the core-corona type particles is broken out in the surface layer portion so that the hydrophobic portion of the core is made exposed. The particles are then melted and adhered to each other to form hydrophobic areas (image portions). Since exposure energy does not easily reach the portion of the thus-formed hydrophobic areas on the side of the support, the hydrophilic macro-monomer remains in the particle surface in the portion. Thus, the hydrophilic group thereof interacts with the hydrophilic support surface to exhibit strong adhesiveness. It is assumed that this strong adhesiveness results in superior printing resistance.

In the non-exposed portions (non-image portions) of the present precursor, the specific water-dispersible particles are contained in the hydrophilic layer, but the specific water-dispersible particles are dispersed in the form of the core-corona type particles (in the state of hydrophilic surface) so that the surface of the precursor support keeps high hydrophilicity.

As described above, in the planographic printing plate precursor based on the present aspect, the hydrophilic layer itself has an image-forming function; hence, it is unnecessary to conduct any development, and printing can be started by exposing the precursor to light and then setting the exposed plate directly to a printing machine. Consequently, the precursor has an advantage that a high-quality printed matter can be obtained at the initial stage of a printing process.

DETAILED DESCRIPTION OF THE INVENTION

[First Embodiment]

The planographic printing plate precursor according to the first aspect of the invention will be described in detail by way of the following first embodiment.

The planographic printing plate precursor of the present embodiment is a planographic printing plate precursor comprising a support, and a hydrophilic layer which is formed on the support and has a crosslinked structure made of an organic/inorganic composite comprising a specific hydrophilic polymer, wherein the hydrophilic layer comprises a photothermal conversion agent (A) and a compound (B) capable of forming a hydrophobic surface area by being heated or irradiated with a radiation, and the hydrophilic layer itself has an image-forming functions.

Respective members of the planographic printing plate precursor of the present embodiment will be described in detail hereinafter.

[Hydrophilic Layer]

The hydrophilic layer in the present embodiment has a hydrophilic graft chain and has a crosslinked structure by formed by hydrolyzing and polycondensing an alkoxide of a metal selected from Si, Ti, Zr and Al. The hydrophilic layer having such a crosslinked structure can be appropriately produced using a compound having the metal alkoxide structure exemplified above and a hydrophilic functional group capable of forming the hydrophilic graft chain. Among the metal alkoxides, alkoxides of Si are preferred from the viewpoints of reactivity and easy availability. Specifically, compounds used as silane coupling compounds can be preferably used.

In the present embodiment, the crosslinked structure formed by hydrolyzing and polycondensing a metal alkoxide as described above will be hereinafter referred to as the sol-gel crosslinked structure according to circumstances.

The hydrophilic layer having the free hydrophilic graft chain and the sol-gel crosslinked structure preferably comprises a hydrophilic polymer which will be described in detail hereinafter.

The following will describe respective constituents in preferred embodiments of the hydrophilic layer according to the present embodiment, and process for producing the hydrophilic layer in detail.

(1. Macromolecular Compound Represented by the General Formula (1))

General formula (1)

(i)

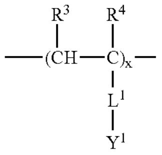

(ii)

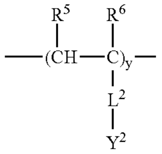

(iii)

$(R^1)_m(OR^2)_{3-m}$—Si—$L^3$—

The polymer compound represented by the general formula (1) is a hydrophilic polymer having, at its terminal, a silane coupling group, and will be hereinafter referred to as the specific hydrophilic polymer according to circumferences.

In the general formula (1), $R^1$, $R^2$, $R^3$, $R^4$, $R^5$ and $R^6$ each independently represent a hydrogen atom or a hydrocarbon group having 8 or less carbon atoms. The hydrocarbon group having 8 or less carbon atoms is preferably a linear, branched or cyclic alkyl group having 8 or less carbon atoms. Specific examples of the alkyl group include methyl, ethyl, propyl, butyl, pentyl, hexyl, heptyl, octyl, isopropyl, isobutyl, s-butyl, t-butyl, isopentyl, neopentyl, 1-methylbutyl, isohexyl, 2-ethylhexyl, 2-methylhexyl and cyclopentyl groups. These hydrocarbon groups may further have a substituent.

Preferred examples of each of $R^1$, $R^2$, $R^3$, $R^4$, $R^5$ and $R^6$ include a hydrogen atom, and methyl and ethyl groups.

$L^1$, $L^2$ and $L^3$ each represent a single bond and an organic linking group. The organic linking group is a polyvalent linking group made of non-metallic atoms, and is specifically made of 1 to 60 carbon atoms, 0 to 10 nitrogen atoms, 0 to 50 oxygen atoms, and 1 to 100 hydrogen atoms, and 0 to 20 sulfur atoms. More specific examples of the linking group include groups made of any one of the following structural units or made of any combination of these units.

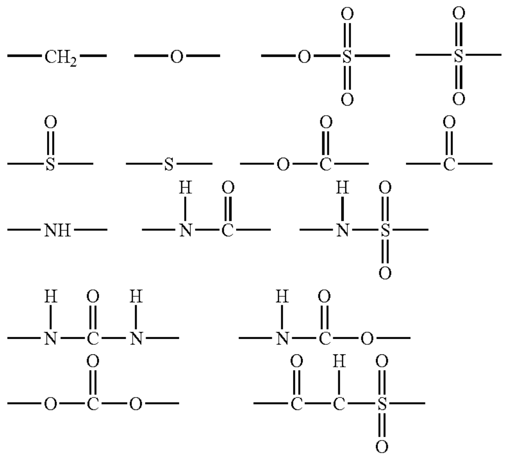

-continued

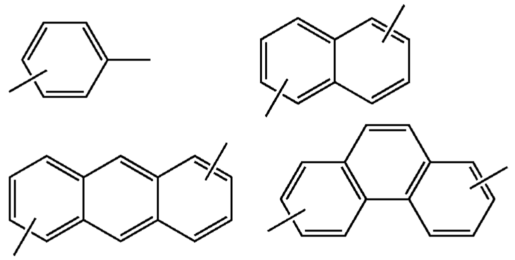

$Y^1$ and $Y^2$ each independently represent —$N(R^7)(R^8)$, —OH, —$NHCOR^7$, —$COR^7$, —$CO_2M$ or —$SO_3M$ wherein $R^7$ and $R^8$ each independently represent a hydrogen atom, or an alkyl group having 1 to 8 carbon atoms, M represents a hydrogen atom, an alkali metal, an alkali earth metal or an onium. Regarding —$N(R^7)(R^8)$, $R^7$ and $R^8$ may be bonded to each other to form a ring. The formed ring may be a hetero ring, which contains a hetero atom such as an oxygen atom, a sulfur atom or a nitrogen atom.

$R^7$ and $R^8$ each independently represent a hydrogen atom or a hydrocarbon group having 8 or less carbon atoms. Examples of the hydrocarbon group include alkyl and aryl groups. Linear, branched or cyclic alkyl groups having 8 or less carbon atoms are preferred. Specific examples thereof include methyl, ethyl, propyl, butyl, pentyl, hexyl, heptyl, octyl, isopropyl, isobutyl, s-butyl, t-butyl, isopentyl, neopentyl, 1-methylbutyl, isohexyl, 2-ethylhexyl, 2-methylhexyl and cyclopentyl groups.

These hydrocarbon groups may further have a substituent. When the alkyl group has a substituent, the substituted alkyl group has a structure in which the substituent and an alkylene group are bonded to each other. As the substituent, any monovalent non-metallic atomic group except hydrogen can be used. Preferred examples thereof include halogen atoms (—F, Br, —Cl, and —I); and the following groups or conjugated base groups: hydroxyl, alkoxy, aryloxy, mercapto, alkylthio, arylthio, alkyldithio, aryldithio, amino, N-alkylamino, N,N-diarylamino, N-alkyl-N-arylamino, acyloxy, carbamoyloxy, N-alkylcarbamoyloxy, N-arylcarbamoyloxy, N,N-dialkylcarbamoyloxy, N,N-diarylcarbamoyloxy, N-alkyl-N-arylcarbamoyloxy, alkylsulfoxy, arylsulfoxy, acylthio, acylamino, N-alkylacylamino, N-arylacylamino, ureido, N'-alkylureido, N',N'-dialkylureido, N'-arylureido, N',N'-diarylureido, N'-alkyl-N'-arylureido, N-alkylureido, N-arylureido, N'-alkyl-N-alkylureido, N'-alkyl-N-arylureido, N',N'-dialkyl-N-alkylureido, N',N'-dialkyl-N-arylureido, N'-aryl-N-alkylureido, N'-aryl-N-arylureido, N',N'-diaryl-N-alkylureido, N',N'-diaryl-N-arylureido, N'-alkyl-N'-aryl-N-alkylureido, N'-alkyl-N'-aryl-N-arylureido, alkoxycarbonylamino, aryloxycarbonylamino, N-alkyl-N-alkoxycarbonylamino, N-alkyl-N-aryloxycarbonylamino, N-aryl-N-alkoxycarbonylamino, N-aryl-N-aryloxycarbonylamino, formyl, acyl, carboxyl, alkoxycarbonyl, aryloxycarbonyl, carbamoyl, N-alkylcarbamoyl, N,N-dialkylcarbamoyl, N-arylcarbamoyl, N,N-diarylcarbamoyl, N-alkyl-N-arylcarbamoyl, alkylsulfinyl, arylsulfinyl, alkylsulfonyl, arylsulfonyl, sulfo (—$SO_3H$) and conjugated base groups thereof (referred to as sulfonato), alkoxysulfonyl, aryloxysulfonyl, sulfinamoyl, N-alkylsulfinamoyl, N,N-dialkylsulfinamoyl, N-arylsulfinamoyl, N,N-diarylsulfinamoyl, N-alkyl-N-arylsulfinamoyl, sulfamoyl, N-alkylsulfamoyl, N,N-dialkylsulfamoyl, N-arylsulfamoyl, N,N-diarylsulfamoyl, N-alkyl-N-arylsulfamoyl, phosphono (—$PO_3H_2$) and conjugated base groups thereof (referred to as phosphonato hereinafter), dialkylphosphono (—$PO_3$(alkyl)$_2$), diarylphosphono (—$PO_3$(aryl)$_2$), alkylarylphosphono (—$PO_3$(alkyl)(aryl)), monoalkylphosphono (—$PO_3H$(alkyl)) and conjugated base groups thereof (referred to as alkylphosphonato hereinafter), monoarylphosphono (—$PO_3H$(aryl)) and conjugated base groups thereof (referred to as arylphosphonato hereinafter), phosphonoxy (—$OPO_3H4$) and conjugated base groups thereof (referred to phosphonatoxy hereinafter), dialkylphosphonoxy (—$OPO_3$(alkyl)$_2$), diarylphosphonoxy (—$OPO_3$(aryl)$_2$), alkylarylphosphonoxy (—OPO(alkyl)(aryl)), monoalkylphosphonoxy (—$OPO_3H$(alkyl)) and conjugated base groups thereof (referred to as alkylphosphonatoxy hereinafter, monoarylphosphonoxy (—$OPO_3H$(aryl)) and conjugated base groups thereof (referred to as arylphosphonatoxy hereinafter), morpholino, cyano, nitro, aryl, alkenyl and alkynyl.

Specific examples of the alkyl group in these substituents are the same alkyl groups as described above. Specific examples of the aryl group therein include phenyl, biphenyl, naphthyl, tolyl, xylyl, mesityl, cumenyl, chlorophenyl, bromophenyl, chloromethylphenyl, hydroxyphenyl, methoxyphenyl, ethoxyphenyl, phenoxyphenyl, acetoxyphenyl, benzoyloxyphenyl, methylthiophenyl, phenylthiophenyl, methylaminophenyl, dimethylaminophenyl, acetylaminophenyl, carboxyphenyl, methoxycarbonylphenyl, ethoxyphenylcarbonyl, phenoxycarbonylphenyl, N-phenylcarbamoylphenyl, pheneyl, cyanophenyl, sulfophenyl, sulfonatophenyl, phosphonophenyl, and phosphonatophenyl groups. Examples of the alkenyl group therein include vinyl, 1-propenyl, 1-butenyl, cinnamyl, and 2-chloro-1-ethenyl groups. Examples of the alkynyl group therein include ethynyl, 1-propynyl, 1-butynyl, and trimethylsilylethynyl groups. Examples of $G^1$ in the acyl group ($G^1$CO—) therein include hydrogen and the same alkyl and aryl groups as described above.

Among these substituents, more preferred are halogen atoms (—F, Br, —Cl and —I), and alkoxy, aryloxy, alkylthio, arylthio, N-alkylamino, N,N-dialkylamino, acyloxy, N-alkylcarbamoyloxy, N-arylcarbamoyloxy, acylamino, formyl, acyl, carboxyl, alkoxycarbonyl, aryloxycarbonyl, carbamoyl, N-alkylcarbamoyl, N,N-dialkylcarbamoyl, N-arylcarbamoyl, N-alkyl-N-arylcarbamoyl, sulfo, sulfonato, sulfamoyl, N-alkylsulfamoyl, N,N-dialkylsulfamoyl, N-arylsulfamoyl, N-alkyl-N-arylsulfamoyl, phosphono, phosphonato, dialkylphosphono, diarylphosphono, monoalkylphosphono, alkylphosphonato, monoarylphosphono, arylphosphonato, phosphonoxy, phosphonatoxy, aryl, and alkenyl groups.

The alkylene group in the substituted alkyl group may be a bivalent organic residue obtained by removing, from the above-mentioned alkyl group having 1 to 20 carbon atoms, any hydrogen atom on carbons in the alkyl group. Preferred examples thereof include linear alkylene groups having 1 to 12 carbon atoms, branched alkylene groups having 3 to 12 carbon atoms, and cyclic alkylene groups having 5 to 10 carbon atoms. Preferred and specific examples of the substituted alkyl group obtained by combining the substituent with the alkylene group include chloromethyl, bromomethyl, 2-chloroethyl, trifluoromethyl, methoxymethyl, methoxyethoxyethyl, allyloxymethyl, phenoxymethyl, methylthiomethyl, tolylthiomethyl, ethylaminoethyl, diethylaminopropyl, morpholinopropyl, acetyloxymethyl, benzoyloxymethyl, N-cyclohexylcarbamoyloxyethyl, N-phenylcarbamoyloxyethyl, acetylaminoethyl, N-methylbenzoylaminopropyl, 2-oxyethyl, 2-oxypropyl, carboxypropyl, methoxycarbonylethyl, allyloxycarbonylbutyl, chlorophenoxycarbonylmethyl, carbamoylmethyl, N-methylcarbamoylethyl, N,N-dipropylcarbamoylmethyl, N-(methoxyphenyl)carbamoylethyl, N-methyl-N-(sulfophenyl)carbamoylmethyl, sulfobutyl, sulfonatobutyl, sulfamoylbutyl, N-ethylsulfamoylmethyl, N,N-dipropylsulfamoylpropyl, N-tolylsulfomoylpropyl, N-methyl-N-(phosphonophenyl) sulfamoyloctyl, phosphonobutyl, phosphonatohexyl, diethylphosphonobutyl, diphenylphosphonopropyl, methylphosphonobutyl, methylphosphonatobutyl, tolylphosphonohexyl, tolylphosphonatohexyl, phosphonoxypropyl, phosphonatoxybutyl, benzyl, phenethyl, α-methylbenzyl, 1-methyl-1-phenylethyl, p-methylbenzyl, cynnamyl, allyl, 1-propenylmethyl, 2-butenyl, 2-methylallyl, 2-methylpropenylmethyl, 2-propynyl, 2-butynyl, and 3-butynyl groups.

M represents a hydrogen atom; an alkali metal such as lithium, sodium or potassium; an alkali earth metal such as calcium, or barium; or an onium such as ammonium, iodonium or sulfonium.

Specific examples of the hydrophilic polymer in the invention are listed below. In the invention, however, the specific hydrophilic polymer is not limited to these examples.

(1-1)

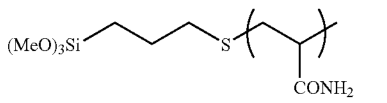

(1-2)

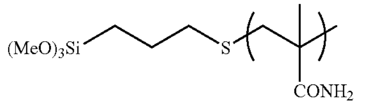

(1-3)

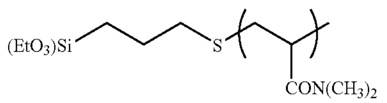

(1-4)

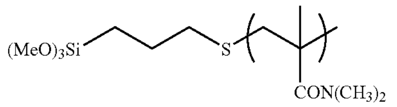

(1-5)

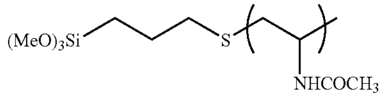

(1-6)

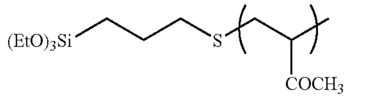

(1-7)

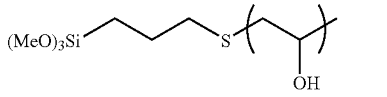

(1-8)

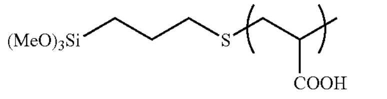

(1-9)

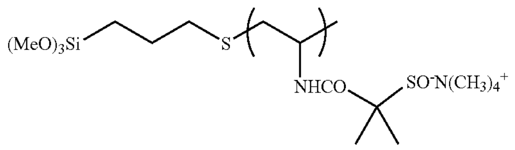

-continued (1-10)

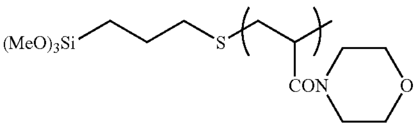

(1-11)

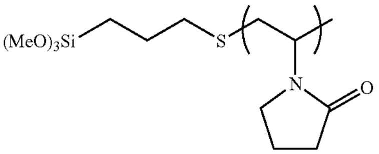

(1-12)

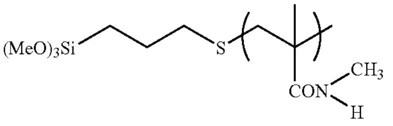

(1-13)

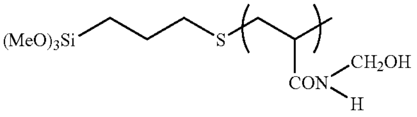

(1-14)

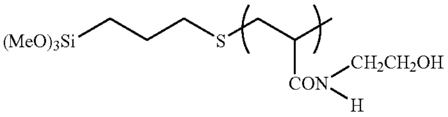

(1-15)

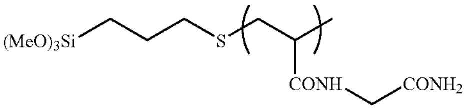

(1-16)

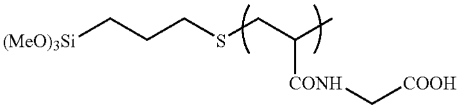

(1-17)

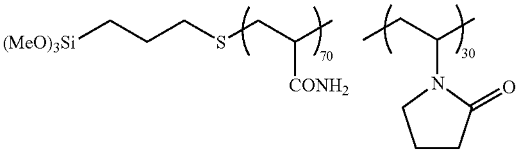

(1-18)

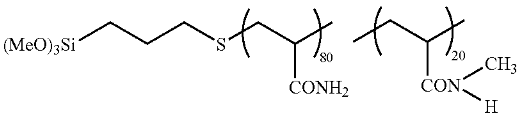

(1-19)

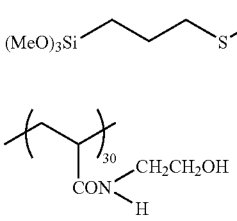

(1-20)

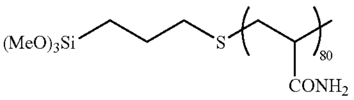

-continued

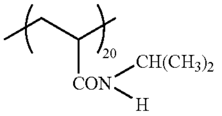

(1-21)

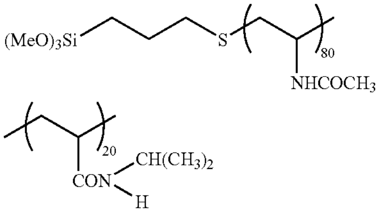

(1-22)

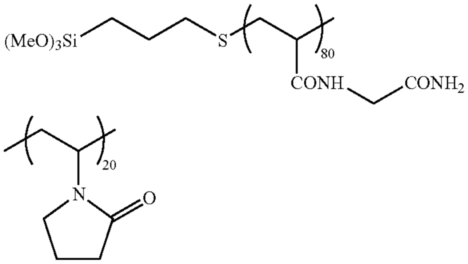

(1-23)

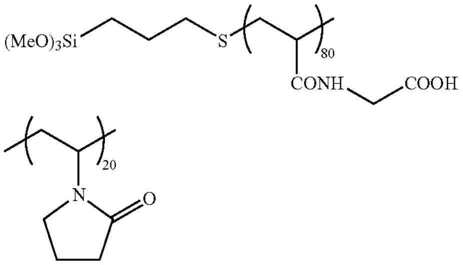

The hydrophilic polymer in the invention can be synthesized by radical-polymerizing an unsaturated compound represented by the following general formula (3) and/or an unsaturated compound represented by the following general formula (4) with a silane compound which contains a mercapto group and represented by the following general formula (5).

(3)

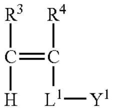

(4)

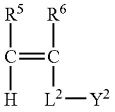

(5)

$$(R^1)_m(OR^2)_{3-m}\text{—Si—}L^3\text{—S—H}$$

The mercapto group containing silane compound (5) has chain transferring ability. Therefore, in the radical polymerization, a polymer having, at a terminal of the main chain thereof, an introduced silane coupling group can be synthesized.

In the above-mentioned formulas (3), (4), and (5), $R^1$ to $R^6$, $L^1$, $L^2$, $L^3$, $Y^1$, $Y^2$ and m are defined as in the formula (1). These compounds are commercially available and can also be synthesized with ease.

(Reaction Style)

The reaction style, when the mercapto group containing silane compound (5) represented by the general formula (5) is made to radical-react with the unsaturated compound(s) represented by the general formula (3) and/or the general formula (4), is not particularly limited. Preferably, in the presence of a radical initiator or under radiation of light from a high-pressure mercury lamp, for example, bulk reaction, solution reaction, suspension reaction (emulsion reaction), or some other reaction is conducted. The polymerization manner may also be appropriately selected, dependently on purpose, from a batch manner (examples thereof including a separate addition manner and a successive addition manner), a semi-continuous manner and a continuous manner. The separate addition manner, which may be referred to as the separating charging manner, of the unsaturated compound(s), or the successive addition manner, which may be referred to as the increment manner, of the unsaturated compound(s) is a particularly preferred polymerizing manner since homopolymerization of the unsaturated compound(s) represented by the general formula (3) and/or the general formula (4) is effectively suppressed. It is known that, for example, when the mercapto group containing silane compound represented by the general formula (5) is made to radical-polymerize with the unsaturated compound(s) represented by the general formula (3) and/or the general formula (4) (at a mole ratio of 1/1), a homopolymer or homopolymers of the unsaturated compound(s) represented by the general formula (3) and/or the general formula (4) may be generated, depending on a polymerizing temperature condition, in a percentage of about 10% by mass when these compounds are radical-polymerized at a single stage. On the other hand, when the separate addition manner is used to radical-polymerize these compounds, for example, at three separated stages, the amount of the homopolymer(s) generated from the unsaturated compound(s) represented by the general formula (3) and/or (4) can easily be suppressed to a percentage of about less than 10% by mass under the same polymerizing temperature condition.

(Reaction Ratio)

The reaction ratio of the unsaturated compound(s) represented by the general formula (3) and/or the general formula (4) to the mercapto group containing silane compound represented by the general formula (5) is not particularly limited. The reaction amount of the unsaturated compound(s) represented by the general formula (3) and/or the general formula (4) per mole of the mercapto group containing silane compound represented by the general formula (5) is preferably set into the range of 0.5 to 50 moles. If the reaction amount is out of this range, a side reaction easily occurs so that the yield of the hydrolyzable silane compound may fall. Accordingly, the reaction amount of the unsaturated compound(s) represented by the general formula (3) and/or the general formula (4) per mole of the mercapto group containing silane compound represented by the general formula (5) is more preferably set into the range of 1 to 45 moles, still more preferably the range of 5 to 40 moles.

The reaction ratio between the unsaturated compounds represented by the general formulas (3) and (4) is not particularly limited, either. The reaction amount of the unsaturated compound represented by the general formula (3) is preferably set into the range of 100 to 1 mole, more preferably from 100 to 5 moles per 100 moles of the total amount of the unsaturated compounds represented by the general formulas (3) and (4).

(Radical Initiator)

The radical initiator is preferably an azo type radical initiator or an organic peroxide, and is more preferably an azo type radical initiator. Specific and preferred examples of the azo type radical initiator include 2,2'-azobisisobutyronitrile, 1,1'-azobis(cyclohexane-1-carbonitrile), 2,2'-azobis(4-methoxy-2,4-dimethylvaleronitrile), 2,2'-azobis(2,4-dimethylvaleronitrile), 2,2'-azobis(2-methylvaleronitrile), 1-[(1-cyano-1-methylethyl)azo]formamide, 2-phenylazo-4-methoxy-2,4-dimethyl-valeronitrile, dimethyl-2,2'-azobis (2-methylpropionate), 2,2'-azobis[2-methyl-N-[1,1-bis (hydroxymethyl)-2-hydroxyethyl]propioneamide], 2,2'-azobis[2-methyl-N-[1,1-bis(hydroxymethyl)ethyl] propioneamide], 2,2'-azobis[2-methyl-N-(2-hydroxyethyl) propioneamide], 2,2'-azobis[2-(5-methyl-2-imidazoline-2-yl)propane]dihydrochloride, 2,2'-azobis[2-(2-imidazoline-2-yl)propane]dihydrochloride, 2,2'-azobis[2-(4,5,6,7-tetrahydro-1H-1,3-diazepine-2-yl)propane]dihydrochloride, 2,2'-azobis[2-(3,4,5,6-tetrahydropyrimidine-2-yl)propane] dihydrochloride, 2,2'-azobis[2-(5-hydroxy-3,4,5,6-tetrahydropyrimidine-2-yl)propane]dihydrochloride, 2,2'-azobis[2-[1-(2-hydroxyethyl)-2-imidazoline-2-yl]propane] dihydrochloride, 2,2'-azobis[2-(2-imidazoline-2-yl) propane], 2,2'-azobis (2-methyl-N-phenylpropioneamidine) dihydrochloride, 2,2'-azobis[N-(4-chlorophenyl)-2-methylpropioneamidine]dihydrochloride, 2,2'-azobis[N-(4-hydroxyphenyl)-2-methylpropioneamidine] dihydrochloride, 2,2'-azobis[2-methyl-N-(phenylmethyl) propioneamidine]dihydrochloride, 2,2'-azobis[2-methyl-N-(2-propenyl)propioneamidine]dihydrochloride, 2,2'-azobis (2-methylpropioneamidine)dihydrochloride, 2,2'-azobis[N-(2-hydroxyethyl)-2-methyl-propioneamidine] dihydrochloride. These may be used alone or in combination.

The amount of the radical initiator to be added is preferably set into the range of 0.001 to 20 parts by weight, more preferably the range of 0.1 to 10 parts by weight, and still more preferably the range of 0.1 to 5 parts by weight per 100 parts by weight of the total of the unsaturated compounds) represented by the general formula (3) and/or the general formula (4) and the mercapto group containing silane compound represented by the general formula (5).

(Reaction Temperature)

The reaction temperature is not particularly limited when the mercapto group containing silane compound represented by the general formula (5) is caused to be reacted with the unsaturated compound(s) represented by the general formula (3) and/or the general formula (4). For example, the temperature is preferably a value within the range of −50 to 200° C. If the reaction temperature is less than −50° C., the reactivity between these components may lower remarkably. On the other hand, if the reaction temperature is more than 200° C., the type of the solvent which can be used is excessively limited or a side reaction may easily occur. Accordingly, the reaction temperature is preferably from 0 to 100° C., more preferably from 30 to 100° C. In the case of using an unsaturated compound in which the rate of the radical polymerization of the compound itself is large, for example, acrylic acid, as the unsaturated compound in the invention, it is most preferred to set the reaction temperature to a value within the range of 30 to 70° C. At such a reaction temperature, the homopolymerization of the unsaturated compound is more effectively suppressed without lowering the reaction rate.

(Reaction Time)

The reaction time, which varies depending on the reaction temperature and other factors, is preferably from 0.5 to 1000 hours, more preferably from 1 to 24 hours from the viewpoints of reliably completing the reaction and achieving sufficiently high productivity.

(Solvent)

When the mercapto group containing silane compound represented by the general formula (5) is made to be reacted with the unsaturated compound(s) represented by the general formula (3) and/or the general formula (4), it is preferred to use a solvent in order to cause these components to be reacted with each other homogeneously. Examples of the solvent include ethyl lactate, methyl ethyl ketone, cyclohexanone, dimethylsulfoxide, ethylene glycol monobutyl ether acetate, diethyldiglycol, methylpropylene glycol, diacetone alcohol, methoxypropyl acetate, diethylene glycol monobutyl ether acetate, diethylene glycol monoethyl ether acetate, ethyl-3-ethoxypropionate, diethylene glycol dimethyl ether, N,N-dimethylacetoamide, 1,3-dimethyl-2-imidazolidinone, methyl-3-methoxypropionate, 2-heptanone, toluene, tetrahydrofuran, dioxane, chloroform, hexane, methanol and ethanol. These may be used alone or in combination. The use amount of the solvent is preferably set into the range of 1 to 10,000 parts by weight, more preferably the range of 50 to 1,000 parts by weight, and still more preferably the range of 50 to 800 parts by weight per 100 parts by weight of the total of the mercapto group containing silane compound represented by the general formula (5) and the unsaturated compound(s) represented by the general formula (3) and/or the general formula (4).

(Reaction Atmosphere)

When the mercapto group containing silane compound represented by the general formula (5) is made to be reacted with the unsaturated compound(s) represented by the general formula (3) and/or the general formula (4), the type of the reaction atmosphere is not particularly limited. For example, it is preferred to purge the air inside the reaction system with nitrogen or subject the reaction system to deoxydation treatment with ultrasonic waves, and subsequently radical-polymerize these compounds. This is because, when the radical reaction is conducted in nitrogen atmosphere in such a manner, it is possible to suppress effectively the generation of disulfide compounds resulting from coupling reaction between the mercapto groups. In other words, the occurrence of the coupling reaction between mercapto groups, which causes coloration in many cases, is effectively prevented so that a hydrolyzable silane compound having high transparency can be obtained. Further, when water is present in the reaction atmosphere in the reaction system, there arises a problem that the hydrolysis of the alkoxy group is spontaneously advanced with ease at the stage of the radical reaction. In particular, when a hydrolyzable silane having a carboxy group is subjected to radical reaction, the hydrolysis of the alkoxy group easily proceeds in the presence of even a small amount of water. Therefore, when the starting material in use is in a liquid form, the starting material is preferably subjected to dehydration treatment with a dehydrating agent such as a molecular sieve, calcium hydride or magnesium sulfate. Alternatively, the starting material is beforehand subjected to distillation treatment in nitrogen in the presence of such a drying agent, according to necessity.

The molecular weight of the hydrophilic polymer used to form the hydrophilic layer in the present embodiment is not particularly limited. The weight average molecular weight is preferably from 1,000 to 100,000, more preferably from 1,000 to 50,000, and still more preferably from 1,000 to 30,000.

(2. Crosslinking Component Represented by the General Formula (2))

$$(R^7)_m—X—(OR^8)_{4-m} \qquad \text{General formula (2)}$$

The crosslinking component represented by the general formula (2) is a compound which has a polymerizable functional group in the structure thereof and serves as a crosslinking agent, and is polycondensed with the specific hydrophilic polymer to form a firm or strong coating film having a crosslinked structure.

In the general formula (2), $R^7$ represents a hydrogen atom, or an alkyl or aryl group, $R^8$ represents an alkyl or aryl group, X represents Si, Al, Ti or Zr, and m is an integer of 0 to 2.

When $R^7$ and $R^8$ each represent an alkyl group, the number of carbon atoms therein is preferably from 1 to 4. The alkyl or aryl group may have a substituent, and examples of the substituent which can be introduced include a halogen atom, an amino group, and a mercapto group.

This compound is preferably a low molecular weight compound, which has a molecular weight of 1000 or less.

Specific examples of the crosslinking component represented by the general formula (2) are listed up below. In the invention, however, the crosslinking component is not limited to these examples.

When X is Si, that is, when silicon is contained in the hydrolyzable compound, specific examples of the crosslinking component include trimethoxysilane, triethoxysilane, tripropoxysilane, tetramethoxysilane, tetraethoxysilane, tetrapropoxysilane, methyltrimethoxysilane, ethyltriethoxysilane, propyltrimethoxysilane, methyltriethoxysilane, ethyltriethoxysilane, propyltriethoxysilane, dimethyldimethoxysilane, diethyldiethoxysilane, γ-chloropropyltriethoxysilane, γ-mercaptopropyltrimethoxysilane, γ-mercaptopropyltriethoxysilane, γ-aminopropyltriethoxysilane, phenyltrimethoxysilane, phenyltriethoxysilane, phenyltripropoxysilane, diphenyldimethoxysilane and diphenyldiethoxysilane.

Among these examples, particularly preferred examples are tetramethoxysilane, tetraethoxysilane, methyltrimethoxysilane, ethyltrimethoxysilane, methyltriethoxysilane, ethyltriethoxysilane, dimethyldiethoxysilane, phenyltrimethoxysilane, phenyltriethoxysilane, diphenyldimethoxysilane, diphenyldiethoxysilane, and so on.

When X is Al, that is, when aluminum is contained in the hydrolyzable compound, specific examples of the crosslinking component include trimethoxyaluminate, triethoxyaluminate, tripropoxyaluminate, and tetraethoxyaluminate.

When X is Ti, that is, when titanium is contained in the hydrolyzable compound, specific examples of the crosslinking component include trimethoxytitanate, tetramethoxytitanate, triethoxytitanate, tetraethoxytitanate, tetrapropoxytitanate, chlorotrimethoxytitanate, chlorortriethoxytitanate, ethyltrimethoxytitanate, methyltriethoxytitanate, ethyltriethoxytitanate, diethyldiethoxytitanate, phenyltrimethoxytitanate, and phenyltriethoxytitanate.

When X is Zr, that is, when zirconium is contained in the hydrolyzable compound, specific examples of the crosslinking component include zirconates corresponding to the above-mentioned compounds exemplified as the titanium-containing components.

(3. Preparation of the Hydrophilic Layer)

In the present embodiment, the hydrophilic layer can be formed by preparing a hydrophilic coating-solution composition which contains the specific hydrophilic polymer, applying the composition onto an appropriate support, and then drying the applied composition. When the hydrophilic coating-solution composition is prepared, it is preferred that the content by percentage of the specific hydrophilic polymer is 10% or more and less than 50% by mass in terms of solid content thereof. If the content is 50% or more by mass, the film strength trends to lower. If the content is less than 10% by mass, the coating properties deteriorate so that a possibility that the film is cracked becomes high. Thus, both of the cases are not preferred.

In a preferred embodiment in which the crosslinking component is added to the hydrophilic coating-solution composition, the amount of the crosslinking component to be added is preferably 5% or more, more preferably 10% or more by mole of the silane coupling groups in the specific hydrophilic polymer. The upper limit of the amount of the crosslinking component to be added is not particularly limited if the component can be sufficiently crosslinked with the hydrophilic polymer. However, when the crosslinking component is too excessively added, there may be caused such a problem that the formed hydrophilic surface is made sticky by the crosslinking component which is not involved with crosslinking.

The specific hydrophilic polymer having, at the terminal thereof, a silane coupling group is dissolved in a solvent, preferably together with the crosslinking component and then the solution is sufficiently stirred, whereby the mixed component(s) is/are hydrolyzed and polycondensed. As a result, an organic/inorganic composite sol solution is produced as a hydrophilic coating-solution according to the invention. This makes it possible to form a surface hydrophilic layer having high hydrophilicity and high film strength. In order to promote the hydrolysis and polycondensation reaction at the time of preparing the organic/inorganic composite sol solution, it is preferred to use an acidic catalyst or a basic catalyst together. In order to give practically preferable reaction efficiency, it is essential to use the catalyst.

As the catalyst, an acid or a basic compound is used as it is or in a form in which it is dissolved in a solvent such as water or alcohol (hereinafter referred to as an acidic catalyst or a basic catalyst, respectively). The concentration of the acid or the basic compound in the solvent is not particularly limited, and may be appropriately selected depending on properties of the used acid or basis compound, a desired content of the catalyst, and so on. When the concentration of the catalyst is high, the speed of the hydrolysis or the polycondensation trends to become high. However, when the basic catalyst having a high concentration is used, precipitation may be generated in the sol solution. Therefore, when the basic catalyst is used, the concentration thereof is desirably 1 N or less based on the concentration thereof in water.

The type of the acidic catalyst or the basic catalyst is not particularly limited. When it is necessary to use a high-concentration catalyst, it is advisable to use a catalyst made of elements which hardly remain in the dried coating.

Specific examples of the acidic catalyst include halogenated hydrogen such as hydrochloric acid, nitric acid, phosphoric acid, sulfuric acid, sulfurous acid, hydrogen sulfide, perchloric acid, hydrogen peroxide, carbonic acid, carboxylic acids such as formic acid and acetic acid, substituted carboxylic acids, wherein R in carboxylic acid structural formula RCOOH is substituted with a different element or a substituent, and sulfonic acids such as benzenesulfonic acid. Examples of the basic catalyst include ammoniacal bases such as ammonia water, and amines such as ethylamine and aniline.

The hydrophilic coating-solution can be prepared by dissolving a hydrophilic polymer having, at the terminal thereof, a silane coupling group (and preferably a crosslinking component) in a solvent such as ethanol, adding the above-mentioned catalyst to the solution if desired, and stirring the solution. The reaction temperature is preferably from room temperature to 80° C. The reaction time (that is, the time when the stirring is to be continued) is preferably from 1 to 72 hours. This stirring facilitates hydrolysis and polycondensation of the two components, to yield an organic/inorganic composite sol solution.

As the solvent used in the preparation of the hydrophilic coating-solution composition which comprises the hydrophilic polymer and preferably comprises the crosslinking component, any solvent in which these components can be dissolved or dispersed can be used without especial limitation. Preferred examples thereof include aqueous solvents such as methanol, ethanol and water.

As described above, a sol-gel method is used in the preparation of the organic/inorganic composite sol solution (hydrophilic coating-solution composition) for forming the hydrophilic surface according to the present embodiment. The sol-gel method is described in detail in published documents, such as Sumio SAKUHANA "Science of Sol-Gel Method", published by Agne Shofu Co., Ltd. in 1988, and Ken HIRASHIMA "Technique for Forming a Functional Thin Film by The Most Advance Sol-Gel Method", published by Sogo Gijutsu Center in 1992. The methods described in these documents can be used in the preparation of the hydrophilic coating-solution composition according to the present embodiment.

In the hydrophilic coating-solution composition in the present embodiment, various additives can be used in accordance with their purposes, unless the advantageous effects of the present embodiment are damaged. For example, a surfactant can be added thereto in order to improve the homogeneity of the coating-solution.

The hydrophilic coating-solution composition prepared as described above is applied onto a support base material and then dried, whereby the hydrophilic layer can be formed. The film thickness of the hydrophilic layer can be appropriately selected. The amount of the applied film after being dried is generally from 0.5 to 5.0 g/m$^2$, preferably from 1.0 to 3.0 g/m$^2$. If this amount is less than 0.5 g/m$^2$, the hydrophilic effect is not sufficiently exhibited. If the amount is more than 5.0 g/m$^2$, the sensitivity and the film strength tend to deteriorate. Thus, such two cases are not preferred.

[(B) Compound Capable of Forming a Hydrophobic Surface Area by Being Heated or Irradiated with a Radiation]

The compound having an image forming function, which is added to the hydrophilic layer, is a compound, in a fine particle form, which is capable of forming a hydrophobic area in the hydrophilic layer by being heated or exposed to a radiant layer. Preferred examples thereof include heat-meltable hydrophobic particles and heat-meltable water-dispersible particles.

In particular, the water-dispersible particles have hydrophilic particle surfaces; therefore, when the particles are introduced into the hydrophilic layer, high stain-resistance can be exhibited in non-image portions. Thus, the water-dispersible particles are more preferred for the invention.

(B-1. Heat-Meltable Hydrophobic Particles)

Examples of the heat-meltable hydrophobic particles include polystyrene particles that are described in EP-816070, and hydrophobic particles encapsulated in microcapsule that are described in WO 94/23954.

In the present embodiment, the heat-meltable hydrophobic particles, which are particles of an image forming component contained in the hydrophilic layer, are melted and adhered to each other by heat generated by heating or irradiation with an infrared ray laser, so that hydrophobic areas (ink-receiving areas: image portions) are formed. The heat-meltable hydrophobic particles are made of a hydrophobic organic compound.

The melting point of the hydrophobic organic compound (melt and adhering temperature) is preferably from 50 to 200° C. since the particles having the melting point in that range are rapidly melted and adhered by ordinary heating. If the aforementioned melting point is less than 50° C., there is a possibility that the particles of the hydrophobic organic compound are softened or melted in an undesirable manner by effect of heat in the step of drying the coating film or other steps in the precursor-producing process or effect of environment temperature or other factors in the storing process. The aforementioned melting point of the hydrophobic organic compound is preferably 80° C. or more. Considering the stability with the passage of time, the melting point is more preferably 100° C. or more. As the melting point is higher, the stability is better. However, the melting point is desirably 200° C. or less in consideration of the recording sensitivity and handling performance.

Specific and preferred examples of the hydrophobic organic compound which constitutes the heat-meltable hydrophobic particles include resins such as polystyrene, polyvinyl chloride, methyl polymethacrylate, polyvinylidene chloride, polyacrylonitrile, polyvinyl carbazole, copolymers thereof, and mixtures thereof; aliphatic waxes such as polyolefin waxes (for example, paraffin wax, micro wax, polyethylene wax and polypropylene wax), stearic amide, linolenic amide, lauryl amide, myristyl amide, palmitic amide, oleic amide; higher aliphatic acids such as stearic acid, tridecanoic acid and palmitic acid.

As the image forming component which is incorporated into the hydrophilic layer in the present embodiment, heat-meltable hydrophobic particles which are easily melted, and adhered to and integrated with each other by heat are preferred among the above-mentioned hydrophobic organic compound particles, from the viewpoint of image formability. From the viewpoint of the prevention of deterioration in hydrophilicity, particles which have hydrophilic surfaces and can easily be dispersed in water are particularly preferred.

The hydrophilicity of the surfaces of the heat-meltable hydrophobic particles is regarded as sufficient in a case where the contact angle (of a water droplet in the air) with respect to a film, produced by applying only the heat-meltable hydrophobic particles to a support and drying the particles at a temperature lower than the solidification temperature thereof, becomes lower than the contact angle (of a water droplet in the air) with respect to a film, produced by applying only the heat-meltable hydrophobic particles to a support and drying the particles at a temperature higher than the solidification temperature. Particles having such hydrophilicity are preferred.

In order to set the hydrophilicity of the heat-meltable hydrophobic particle surfaces in such a preferred state, it is suggested to cause a hydrophilic polymer or oligomer, such as polyvinyl alcohol or polyethylene glycol, or a hydrophilic low molecular weight compound to be adsorbed on the heat-meltable hydrophobic particle surfaces. However, the method for making the heat-meltable hydrophobic particle surfaces hydrophilic is not limited to this method, and various known methods of making a surface hydrophilic can be used.

The average particle size of the heat-meltable hydrophobic particles is preferably from 0.01 to 20 μm, more preferably from 0.05 to 2.0 μm, and most preferably from 0.1 to 1.0 μm. If the average particle size is too large, the resolution tends to be bad. If the average particle size is too small, there is a possibility that the long-term stability may deteriorate.

The amount of the heat-meltable hydrophobic particles to be added is preferably from 30 to 98%, more preferably from 40 to 95% by mass of solid contents in the hydrophilic layer.

(B-2. Water-Dispersible Particles)

The water-dispersible particles, of the present embodiment, which are used as an image-recording component and are capable of forming a hydrophobic surface area by being heated or irradiated by a radiation, are hydrophobic polymer particles in which adjacent particles are melted and adhered to each other by being heated or irradiated with the radiation so that the hydrophobic surface area can be formed. These particles are particles having high water-dispersibility since the surfaces thereof are made hydrophilic.

Specifically, the water-dispersible particles are preferably particles obtained by dissolving a hydrophobic polymer having a structural unit represented by the following general formula (6) into a solvent miscible with water; dispersing the solution into a water phase which contains a hydrophilic resin having a structural unit represented by the following general formula (1) or (7) and/or particles of an oxide of at least one element selected from the elements in the 2 to 15 groups in the periodic table, so as to form oil droplets; and then removing the solvent from the oil droplets.

General formula (6)

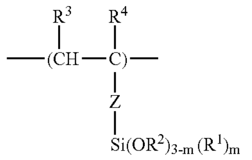

In the formula (6), $R^1$, $R^2$, $R^3$ and $R^4$ each independently represent a hydrogen atom or a hydrocarbon group having 1 to 8 carbon atoms, m is 0, 1 or 2, Z represents a group selected from the following:

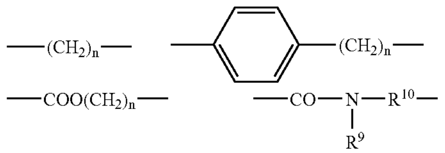

Wherein $R^9$ represents a hydrocarbon group having 1 to 8 carbon atoms, $R^{10}$ represents an alkylene group having 5 or less carbon atoms, or a bivalent organic residue in which a plurality of chain-like carbon atom groups are bonded to each other through a carbon atom or a nitrogen atom, and n is an integer of 0 to 4.

General formula (1)

(i)

(ii)

(iii)

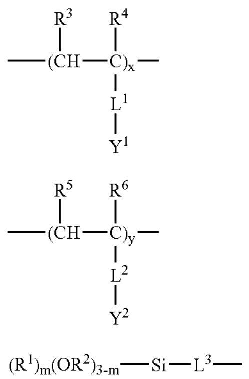

General formula (7)

(i')

(ii')

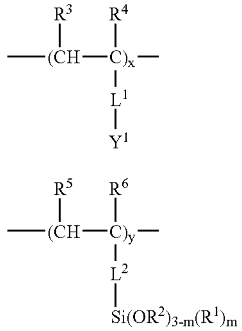

The general formula (1) represents a polymer compound having a silane coupling group represented by the structural unit (iii) at a terminal of a polymer unit represented by the structural unit (i) and optionally a polymer unit represented by the structural unit (ii) In the formula (1), $R^1$, $R^2$, $R^3$, $R^4$, $R^5$ and $R^6$ each independently represent a hydrogen atom or a hydrocarbon group having 8 or less carbon atoms, m is 0, 1 or 2, x and y are values satisfying the equation x+y=100 and the ratio of x:y is in a range from 100:0 to 1:99. $L^1$, $L^2$ and $L^3$ each independently represent a single bond and an organic linking group, and $Y^1$ and $Y^2$ each independently represent—$N(R^7)(R^8)$, —OH, —$NHCOR^7$, —$COR^7$, —$CO_2M$ or —$SO_3M$ wherein $R^7$ and $R^8$ each independently represent a hydrogen atom, or an alkyl group having 1 to 8 carbon atoms, and M represents a hydrogen atom, an alkali metal, an alkali earth metal or an onium.

In the general formula (7), $R^1$, $R^2$, $R^3$, $R^4$, $R^5$ and $R^6$ each independently represent a hydrogen atom or a hydrocarbon group having 8 or less carbon atoms, m is 0, 1 or 2, x and y are values satisfying the equation x+y=100 and the ratio of x:y is in a range from 99:1 to 50:50. $L^1$ and $L^2$ each independently represent a single bond and an organic linking group, and $Y^1$ and $Y^2$ each independently represent —$N(R^7)(R^8)$, —OH, —$NHCOR^7$, —$COR^7$, —$CO_2M$ or —$SO_3M$ wherein $R^7$ and $R^8$ each independently represent a hydrogen atom, or an alkyl group having 1 to 8 carbon atoms, and M represents a hydrogen atom, an alkali metal, an alkali earth metal or an onium.

(B-3. Hydrophobic Polymer)

The hydrophobic polymer used as an image forming component in the present embodiment is a hydrophobic polymer which can be dissolved in a solvent immiscible with water, and is a polymer having a structural unit which contains an organic silicon group represented by the general formula (6).

This organic silicon group containing polymer can be obtained by homopolymerizing an unsaturated double-bond monomer which can be converted into the structural unit represented by the general formula (6), or copolymerizing this monomer with a monomer such as a styrene-based, acryl-based, vinyl-based, or olefin-based monomer. The organic silicon group containing polymer in the present embodiment may be a polymer in which the organic silicon group containing structural unit is introduced at random into the molecule thereof, or may be a polymer in which the structure unit is introduced into a terminal of the molecule.

Specific examples of the unsaturated double-bond monomer which can be converted to the structural unit containing the organic silicon group represented by the general formula (6) include styrylethyltrimethoxysilane, 4-trimethoxysilylstyrene, 3-(N-styrylmethyl-2-aminoethylamino)propyltrimethoxysilane, vinyltrimethoxysilane, vinyltris-(β-methoxyethoxy)silane, allyltrimethoxysilane, vinyltriacetoxyssilane, allyltriacetoxysilane, vinylmethyldimethoxysilane, vinyldimethymethoxysilane, vinylmethyldiethoxysilane, vinyldimethylethoxysilane, vinylmethyldiacetoxysilane, vinyldimethylacetoxysilane, vinylisobutyldimethoxysilane, vinyltriisopropoxysilane, vinyltributoxysilane, vinyltrihexyloxysilane, vinylmethoxydihexyloxysilane, vinyldimethoxyoctyloxysilane, vinylmethoxydioctyloxysilane, vinyltrioctyloxysilane, vinylmethoxydilauroxysilane, vinyldimethoxylauroxysilane, vinylmethoxydioleyloxysilane, vinyldimethoxyoleyloxysilane, 3-(meth)acryloyloxypropyltrimethoxysilane, 3-(meth)acryloyloxypropyltriethoxysilane, 3-(meth)acrylamide-propyltrimethoxysilane, 3-(meth)acrylamide-propyltriethoxysilane, 3-(meth)acrylamide-propyltri(β-methoxyethoxy)silane, 2-(meth)acrylamide-2-methylpropyltrimethoxysilane, 2-(meth)acrylamide-2-methylethyltrimethoxysilane, N-(2-meth)acrylamide-ethyl)-aminopropyltrimethoxysilane, 3-(meth)acrylamide-propyltriacetoxysilane, 2-(meth)acrylamide-ethyltrimethoxysilane, 1-(meth)acrylamide-methyltrimethoxysilane, 3-(meth)acrylamide-propylmethyldimethoxysilane, 3-(meth)acrylamide-propyldimethylmethoxysilane, 3-(N-methyl-(meth)acrylamide)-propyltrimethoxysilane, 3-((meth)acrylamide-methoxy)-3-hydroxypropyltrimethoxysilane, 3-((meth)acrylamide-methoxy)-propyltrimethoxysilane, dimethyl-3-(meth)acrylamide-propyl-3-(trimethoxysilyl)-propylammonium chloride, dimethyl-2-(meth)acrylamide-2-methylpropyl-3-(trimethoxysilyl)propylammonium chloride.

Examples of the monomer which can be used, as a copolymerizing component which constitutes the hydrophobic polymer according to the invention, together with the unsaturated double-bond monomer which can be converted to the structure unit containing the organic silicon group represented by the general formula (6) include monomers described in the following items (a) to (k):

(a) acrylic acid esters, examples of which include acrylic acid esters which may have a substituent, such as methyl acrylate, ethyl acrylate, propyl acrylate, butyl acrylate, amyl acrylate, hexyl acrylate, cyclohexyl acrylate, octyl acrylate, phenyl acrylate, benzyl acrylate, 2-chloroethyl acrylate, 2-hydroxyethyl acrylate, 4-hydroxybutyl acrylate, glycidyl acrylate, N-dimethylaminoethyl acrylate, o-, m- and p-hydroxyphenyl acrylate, (b) methacrylic acid esters, examples of which include methacrylic acid esters which may have a substituent, such as methyl methacrylate, ethyl methacrylate, propyl methacrylate, butyl methacrylate, amyl methacrylate, hexyl methacrylate, cyclohexyl methacrylate, octyl methacrylate, phenyl methacrylate, benzyl methacrylate, 2-chloroethyl methacrylate, 2-hydroxyethyl methacrylate, 4-hydroxybutyl methacrylate, glycidyl methacrylate, N-dimethylaminoethyl methacrylate, o-, m- and p-hydroxyphenyl methacrylate, (c) acrylamides and methacrylamides, examples of which include acrylamide, methacrylamide, N-methylolacrylamide, N-methylolmethacrylamide, N-ethylacrylamide, N-ethylmethacrylamide, N-hexylacrylamide, N-hexylmethacrylamide, N-cyclohexylacrylamide, N-cyclohexylmethacrylamide, N-hydroxyethylacrylamide, N-hydroxyethylmethacrylamide, N-phenylacrylamide, N-phenylmethacrylamide, N-benzylacrylamide, N-benzylmethacrylamide, N-nitrophenylacrylamide, N-nitrophenylmethacrylamide, N-ethyl-N-phenylacrylamide, N-ethyl-N-phenylmethacrylamide, N-(4-hydroxyphenyl) acrylamide, and N-(4-hydroxyphenyl)methacrylamid, (d) vinyl ethers, examples of which include ethyl vinyl ether, 2-chloroethyl vinyl ether, hydroxyethyl vinyl ether, propyl vinyl ether, butyl vinyl ether, octyl vinyl ether, and phenyl vinyl ether, (e) vinyl esters, examples of which include vinyl acetate, vinyl chloroacetate, vinyl butyrate, and vinyl benzoate, (f) syrenes, examples of which include styrene, α-methylstyrene, methylstyrene, chloromethylstyrene, and o-, m- and p-hydroxystyrene, (g) vinyl ketones, examples of which include methyl vinyl ketone, ethyl vinyl ketone, propyl vinyl ketone, and phenyl vinyl ketone, (h) olefins, examples of which include ethylene, propylene, isobutylene, butadiene, and isoprene, (i) N-containing monomers, examples of which include N-vinylprrolidone, N-vinylcarbazole, 4-vinylpyridine, acrylonitrile, and methacrylonitrile, (j) unsaturated sulfonamide, examples of which include acrylamides such as N-(o-aminosulfonylphenyl)acrylamide, N-(m-aminosulfonylphenyl)acrylamide, N-(p-aminosulfonylphenyl)acrylamide, N-[1-(3-aminosulfonyl) naphtyl]acrylamide and N-(2-aminosulfonylethyl) acrylamide; methacrylamides such as N-(o-aminosulfonylphenyl)methacrylamide, N-(m-aminosulfonylphenyl)methacrylamide, N-(p-aminosulfonylphenyl)methacrylamide, N-[1-(3-aminosulfonyl)naphtyl]methacrylamide and N-(2-aminosulfonylethyl)methacrylamide; unsaturated sulfonamides of acrylic acid esters, such as o-aminosulfonylphenyl acrylate, m-aminosulfonylphenyl acrylate, p-aminosulfonylphenyl acrylate and 1-(3-aminosulfonylphenylnaphtyl) acrylate; and unsaturated sulfonamides of methacrylic acid esters, such as o-aminosulfonylphenyl methacrylate, m-aminosulfonylphenyl methacrylate, p-aminosulfonylphenyl methacrylate and 1-(3-aminosulfonylphenylnaphtyl) methacrylate, and (k) usnsaturated acid anhydride, examples of which include itaconic anhydride, maleic anhydride, 2,3-dimethylmaleic anhydride, and 2-chloromaleic anhydride.

In the hydrophobic polymer used in the invention, the content by percentage of the structural unit which contains the organic silicon group represented by the general formula (6) is preferably from 0.01 to 100%, more preferably from 0.05 to 90%, and most preferably from 0.1 to 80% by mole. If the content by percentage of the organic silicon group containing structural unit is less than 0.01% by mole, the advantageous effect of the invention is poorly exhibited.

The weight average molecular weight of the organic polymer compound obtained from these monomers is preferably from 500 to 500,000, and the number average molecular weight thereof is preferably from 200 to 60,000.

The following will illustrate specific examples of the organic silicon group containing polymer preferred as the hydrophobic polymer used in the invention. However, the polymer is not limited to these examples.

PI-1

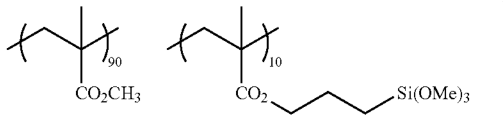

PI-2

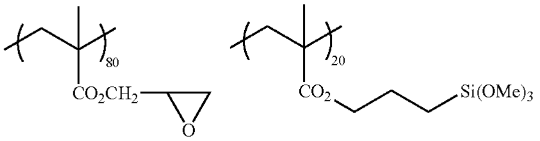

PI-3

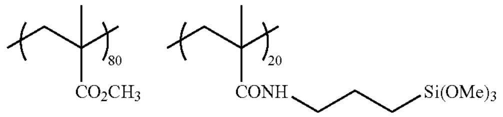

PI-4

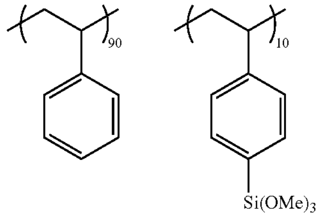

PI-5

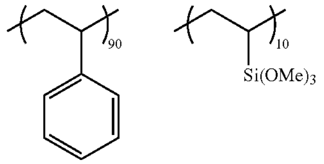

PI-6

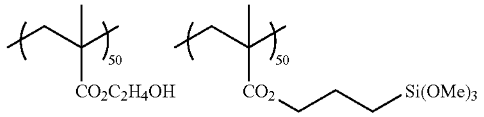

PI-7

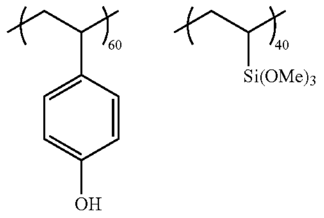

PI-8

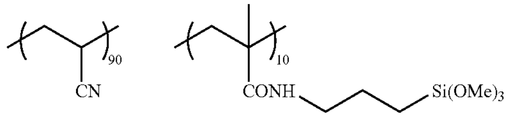

-continued

PI-9

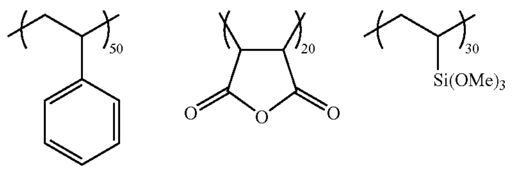

PI-10

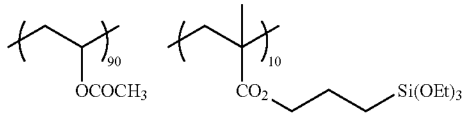

PI-11

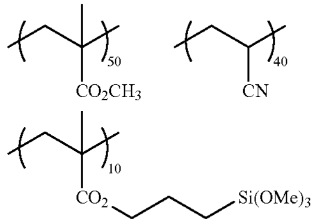

(Solvent Immiscible with Water)

Specific examples of the solvent immiscible with water, which can be used in the preparation of the hydrophobic polymer, include chloromethane, dichloromethane, ethyl acetate, methyl ethyl ketone (MEK), trichloromethane, carbon tetrachloride, ethylene chloride, trichloroethane, toluene, xylene, cyclohexanone and 2-nitropropane. However, the solvent is not limited to these examples, and any solvent which is capable of dissolving the hydrophobic polymer and is immiscible with water can be used in the invention. Particularly useful among the exemplified solvents are dichloroethane and MEK. These are especially preferable in the step of removing the solvent from the oil layer particles by evaporation, thereby hardening the polymer particles rapidly in the preparation of the hydrophobic polymer.

(Water-Soluble Resin)

In the invention, it is necessary that the hydrophobic polymer is water-dispersible, that is, the surface thereof is hydrophilic. When such a hydrophobic polymer having surface hydrophilicity is prepared by dispersing oil droplets in a water phase as described above, it is preferred to incorporate a water-soluble resin into the water phase. In the invention, as the hydrophilic layer, there is used a substance having a crosslinked structure formed by hydrolyzing and polycondensing an alkoxide compound containing an element selected from Si, Ti, Zr and Al; therefore, it is more preferred to use a water-soluble resin capable of generating interaction with the hydrophilic layer.

In order to make a surface of the hydrophobic polymer hydrophilic and facilitates the interaction between the surface and the hydrophilic layer, the water-soluble resin used in thee invention is preferably a water-soluble resin having a structural unit represented by the general formula (1) or (7). This resin is a water-soluble resin having an organic silicon group at the terminal or the side chain thereof. In the water-soluble resin having a structural unit represented by the general formula (7), the content by percentage of the structural unit having an organic silicon group at the side chain thereof, out of the two structural units, is preferably from 0.01 to 20%, more preferably from 1 to 15% by mole from the viewpoint of the water-solubility thereof.

Specific examples of the water-soluble resin having a structural unit represented by the general formula (1) or (7), which can be used in the invention, are listed below. However, the resin is not limited to these examples.

WII-1

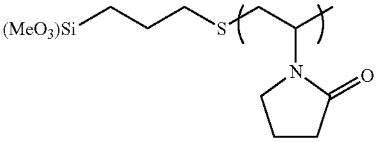

WII-2

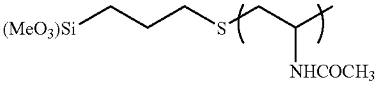

WII-3

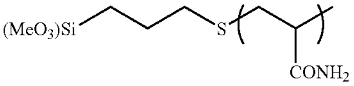

WII-4

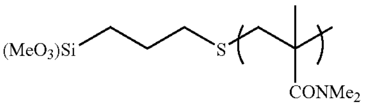

WII-5

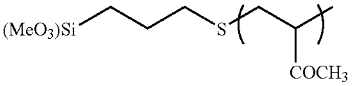

WII-6

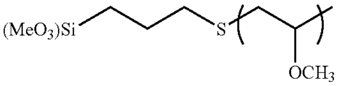

WII-7

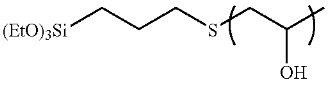

WII-8

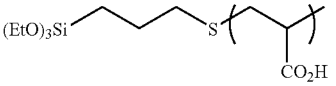

WIII-1

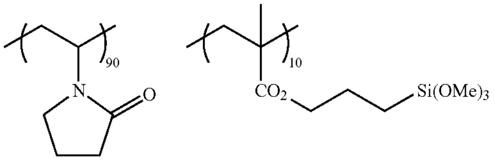

WIII-2

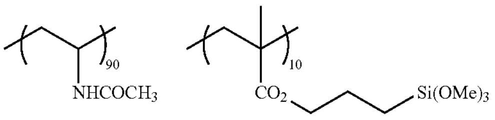

WIII-3

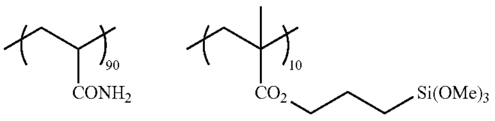

WIII-4

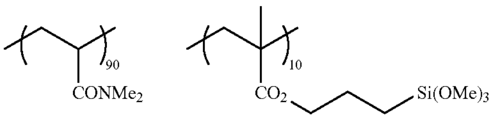

-continued

WIII-5

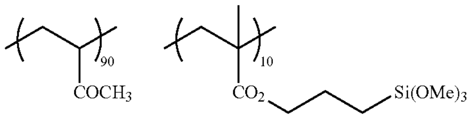

WIII-6

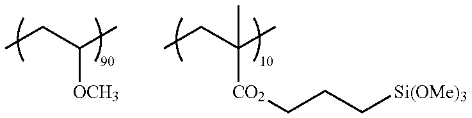

WIII-7

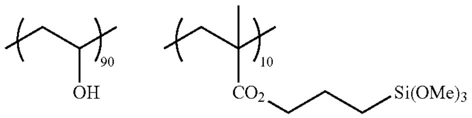

WIII-8

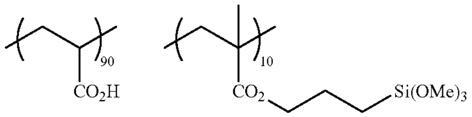

WIII-9

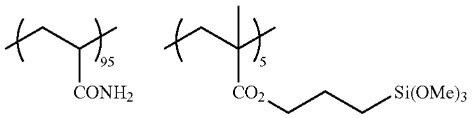

WIII-10

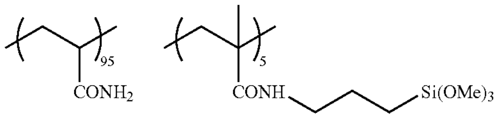

The content by percentage of the water-soluble resin used when the water-dispersible particles, of the present invention, are prepared is generally from 1 to 25%, preferably from 2 to 15% by mass of the water phase components.

(Catalyst)

In the water-dispersible particle producing process in the invention, an acidic catalyst or a basic catalyst can be used in order to promote the hydrolysis or the polycondensation reaction of an organic silicon group present in the structural unit contained in the hydrophobic polymer and represented by the general formula (6) or the structural unit contained as the hydrophilic resin in the water phase and represented by the general formula (1) or (7). The type of the acidic catalyst or the basic catalyst is not particularly limited. When it is necessary to use the catalyst at a high concentration, it is preferable to use a catalyst made of an element that hardly remains after the production of the fine particles.

Specific examples of the acidic catalyst include hydrogen halides such as hydrochloric acid, nitric acid, sulfuric acid, sulfurous acid, hydrogen sulfide, perchloric acid, hydrogen peroxide, carbonic acid, carboxylic acids such as formic acid and acetic acid, substituted carboxylic acids, in which hydrogen in R of the structural formula RCOOH is substituted, and sulfonic acids such as benzenesulfonic acid. Examples of the basic catalyst include ammonia, and amines such as ethylamine and aniline. The catalyst is added to the water phase as it is or in the state of being dissolved in a solvent such as water or alcohol.

The concentration of the added catalyst is not particularly limited. When the concentration is high, the hydrolysis or the polycondensation tends to be speedy. However, if the high-concentration basic catalyst is used, precipitation may be generated in the dispersed solution, resulting in an undesirable effect on the dispersion stability of the oil droplets. Thus, it is desired that the concentration of the basic catalyst is 1 N or less.

(Surfactant)

In the process for producing the water-dispersible particles in the invention, it is preferred to add a surfactant to the water phase in order to improve the dispersion stability of the oil droplets. Examples of the surfactant used in this case include nonionic surfactants, anionic surfactants, cationic surfactants as described in JP-A No. 2-195356, fluorine-containing surfactants, and amphoteric surfactants described in JP-A Nos. 59-121044 and 4-13149.

Specific examples of the nonionic surfactant include polyoxyethylene alkyl ether such as polyoxyethylene lauryl ether, polyoxyethylene stearyl ether, polyoxyethylene cetyl ether, and plyoxyethylene oleyl ether; polyoxyethylene alkyl aryl ether such as polyoxyethylene nonyl phenyl ether; polyoxyethlene/polyoxypropylene block copolymers; composite polyoxyalkylene alkyl ethers in which an aliphatic group having 5 to 24 carbon atoms is ether-bonded to the hydroxyl group at a terminal of a polyoxyethylene/polyoxypropylene block copolymer; composite polyoxyalkylene alkyl aryl ethers in which an alkyl-substituted aryl group is ether-bonded to the hydroxyl group at a terminal of a polyoxyethylene/polyoxypropylene block copolymer; sorbitan aliphatic acid esters such as sorbitan monlaurate, sorbitan monostearate, sorbitan tristearate, sorbitan monopalmitate, sorbitan monooleate, sorbitan trioleate; and polyoxyethylene sorbitan aliphatic acid esters such as polyoxyethylene sorbitan monolaurate, polyoxyethylene sorbitan monopalmitate, polyoxyethylene sorbitan monostearate, polyoxyethylene sorbitan tristearate, and polyoxyethylene sorbitan trioleate.

Specific examples of the anionic surfactant include alkylsulfonic acids, arylsulfonic acids, aliphatic carboxylic acids, alkylnaphthalenesulfonic acids, materials in which an alkylnaphthalenesulfonic acid or naphthalenesulfonic acid is condensed with formaldehyde, aliphatic sulfonic acids having 9 to 26 carbon atoms, alkylbenzenesulfonic acids, and polyoxyethylene-containing sulfuric acid and polyoxyethylene-containing phosphoric acid such as laurylpolyoxyethylenesulfuric acid, cetylpolyoxyethylenesulfonic acid and oleylpolyoxyethylenephosphonic acid.

Specific examples of the cationic surfactant include lauryl amineacetate, lauryltrimethylammonium chloride, distearyldimethylammonium chloride, and alkylbenzyldimethylammonium chloride.

Specific examples of the fluorine-containing surfactant include perfluoroalkylcarboxylic acids, perfluoroalkylphosphoric acid esters, perfluoroalkyltrimethyl ammonium salts, perfluoroalkylbetaine, perfluoroalkylamineoxide, and perfluoroalkyl EO adducts.

Specific examples of the amphoteric surfactant include alkylcarboxybetaines, alkylaminocarboxylic acid salts, alkyldi(aminoethyl)glycines, alkylpolyaminoethylglycine hydrochloric acid salts, 2-alkyl-N-carboxyethyl-N-hydroxyethylimidazolinum betaines, and N-tetradecyl-N,N-betaine type surfactants (for example, Amorgen K (trade name), manufactured by DAIICHI CHEMICAL INDUSTRY CORPORATION).

Particularly preferred are anionic, nonionic, and amphoteric surfactants, specific examples of which include polyoxyetylene alkyl ethers, polyoxyethylene alkyl phenyl ethers, polyoxyethylene/polyoxypropylene block copolymers, alkylsulfonic acids, aliphatic carboxylic acids, alkylbenzenesulfonic acids, polyoyxethylene-containing sulfuric acid, materials in which an alkylnaphthalenesulfonic acid or naphthalenesulfonic acid is condensed with formaldehyde, alkylcarboxybetaines, and alkylaminocarboxylic acids.

As described above, by using the hydrophobic polymer and the water-soluble polymer having a specific organic silicon group, it is possible to yield water-dispersible particles of satisfactory quality, and in a combination thereof with a resin which forms the hydrophilic layer having an image-recording function, for example, a sol-gel convertible binder resin, the organic silicon group can be directly bonded chemically to the matrix of the binder resin by the thermal reactivity of the organic silicon group; therefore, a film having superior mechanical strength and good abrasion resistance can be obtained. In the same manner, in an irradiated area, in which this photosensitive layer is irradiated with a laser ray so as to be converted to a hydrophobic area, the water-dispersible particles can make a homogeneous layer in the state that the particles are chemically bonded to the binder resin. Consequently, an image area having superior abrasion resistance can be formed.

(Oxide or Hydroxide Fine Particles)

In order to improve surface physical properties of the hydrophobic polymer when the water-dispersible particles in the invention are produced, it is acceptable to add an oxide or a hydroxide of at least one element selected from elements in the 2 group to the 15 group in the periodic table, in a form of fine particles, to the water phase, instead of the water-soluble resin or in addition to the water-soluble resin. These fine particles are adsorbed on the surfaces of the hydrophobic particles, to contribute to making the surface hydrophilic and water-dispersibile.

Specific and preferred examples of the element include magnesium, titanium, zirconium, vanadium, chromium, zinc, aluminum, silicon, tin, and iron. Particularly preferred are silicon, titanium, aluminum and tin.

The oxide fine particles or the hydroxide fine particles of the above-mentioned element can be used in the form of oxide colloid or hydroxide colloid. The particle size of the fine particles is generally from about 0.001 to 1 μm, preferably from 5 to 40 nm, and most preferably from 10 to 30 nm.

These colloid dispersed solutions are commercially available form Nissan Chemical Industries, Ltd. or other companies.

The addition of these compounds makes it possible to improve the surface hydrophilicity of the resultant hydrophobic polymer and yield water-dispersible particles having still better dispersion stability in water. Thus, when the particles are used as a recording layer component of a planographic printing plate precursor, stain-resistance in its non-image portions can be improved.

The production of the water-dispersible particles, based on the use of the above-mentioned starting materials, can be performed by well-known operation. That is, first, the following are prepared: an oil phase solution in which the hydrophobic polymer is dissolved in a water-immiscible solvent, and a water solution which contains the water-soluble resin and/or the oxide or hydroxide fine particles of at least one element selected from elements in the 2 group to the 15 group in the periodic table, and contains optional components (for example, the above-mentioned surfactant, and acidic or basic catalyst) if necessary. Thereafter, the two solutions are mixed, and an emulsifying/dispersing machine, such as a homogenizer, is used to stir and mix the resultant vigorously, for example, at a rotation speed of about 12,000 rpm for 10 to 15 minutes, thereby emulsifying and dispersing oil droplets in the water phase.

Next, the resultant emulsified dispersion is heated and stirred to evaporate the solvent, thereby yielding a product in which target water-dispersible particles are dispersed in water. When this product is incorporated into the hydrophilic layer, the incorporation may be performed such that the product is dispersed in the water phase, or such that the product is added as particles after the water phase is removed.

The average particle size of the water-dispersible particles is preferably from 0.01 to 20 μm, more preferably from 0.05 to 2.0 μm, and most preferably from 0.1 to 1.0 μm. If the average particle size is too large, the resolution tends to be deteriorated. If the average particle size is too small, there is a possibility that the long-term stability deteriorates.

The amount of the water-dispersible particles to be added is preferably from 30 to 98%, more preferably from 40 to 95% by mass of solid contents in the hydrophilic layer.

[Photothermal Conversion Agent (A)]

When images are recorded on the planographic printing plate precursor of the invention by an infrared laser or the like, it is necessary for achieving good the sensitivity of the recording to use a photothermal conversion agent (A) for converting photo energy to thermal energy together. The photothermal conversion agent (A) may be added to any one of layers which constitute the planographic printing plate precursor as long as the agent (A) is not included in the compound (B) capable of forming a hydrophobic surface area by being heated or irradiated with a radiation. It is preferred to add the agent (A) to the hydrophilic layer which also functions as an image-forming layer. In addition, the agent (A) maybe added to the support of the precursor, the surface protective layer thereof, or optionally a thin layer which may be formed between the hydrophilic layer and the support.

The expression "the photothermal conversion agent (A) is included in the compound (B) capable of forming a hydrophobic surface area by being heated or irradiated with a radiation" represents, when the water-dispersible particles are given as an example, the following: when the water-dispersible particles are prepared, a dye or pigment having photothermally conversing ability is added to the hydrophobic resin or the like, which is one of the starting materials for the water-dispersible particles, so that the photothermal conversion agent is added to the hydrophobic area formable particles themselves and the former is integrated with the latter. It is necessary for the present embodiment in the invention that the photothermal conversion agent (A) is added separately from or independently of the compound (B) to the hydrophilic layer. The aforementioned state that "the photothermal conversion agent (A) is included in the compound (B)" does not include a state that the photothermal conversion agent (A) added in the state that it is dissolved or dispersed in the matrix of the hydrophilic layer contacts the particle surface of the compound (B).

The type of the photothermal conversion agent that can be used in the planographic printing plate precursor of the present embodiment is not particularly limited. Thus, there can be used any substance that can absorb light, such as an ultraviolet, a visible light, an infrared or a white light, so as to convert the light energy to heat. Preferred examples thereof include metal; oxide, nitride and sulfide of metal; pigments; and dye.

Examples of the metal and the metal compounds include metals and metal compounds which are selected from metals selected from Al, Si, Ti, V, Cr, Mn, Fe, Co, Ni, Cu, Zn, Y, Zr, Mo, Ag, Au, Pt, Pd, Rh, In, Sn and W, and metal compounds thereof and which can be made into particles and dispersed in the hydrophilic layer. Preferred among these examples are metal fine particles of iron, silver, platinum, gold, and palladium.

Other preferred examples are TiOx (x=1.0–2.0), SiOx (x=0.6–2.0), AlOx (x=1.0–2.0), and metal azide compounds such as azide compounds of copper, silver and tin.

Each of the above-mentioned metal oxides, nitrides, and sulfides can be obtained by a known method. Many of them are commercially available under trade names such as Titanium black, Iron black, Molybdenum red, Emerald green, Cadmium red, Cobalt blue, Berlin Blue (Prussian blue), and Ultra marine.

Examples of the pigment contained in the hydrophilic layer in the present embodiment include simple non-metal particles such as carbon black, graphite and bone black, and various organic and inorganic pigments, as well as the above-mentioned metal compounds and metals. From the viewpoint of the advantageous effect of the invention, it is preferred to use, as the pigments and the various fine particles, ones that can easily dispersed in water and have surface hydrophilicity.

Photothermally convertible coloring matters (dyes) can also be used. It is preferred to use, as the colorants, colorants which have an optical absorption range within the range of spectroscopic wavelengths of radiating-light used in image-formation and can easily be dissolved in water.

Preferable coloring matters which are in the form of solid fine particles and have dyeing ability and molecule-dispersibility are known as infrared absorbing agents. Specific examples thereof include polymethine dyes, cyanine dyes, squarylium dyes, pyrylium dyes, diimmonium dyes, phthalocyanine compounds, triarylmethane dyes, and metal dithiolene. More preferred among these dyes are polymethine dyes, cyanine dyes, squarylium dyes, pyrylium dyes, diimmonium dyes, and phthalocyanine compounds. Most preferred are polymethine dyes, cyanine dyes, and phthalocyanine compounds from the viewpoint of synthesis easiness. It is preferred from the viewpoint of stain resistance in the non-image portions that the above-mentioned dye is a water-soluble dye having, in the molecule thereof, a water-soluble group such as a sulfonic acid group, a carboxylic acid group or a phosphonic acid group.

Specific examples of the dye (i.e., the infrared absorbing agent) which is used as the photothermal conversion agent in the present embodiment are listed up below. However, the dye is not limited to these examples.

(IR-1)

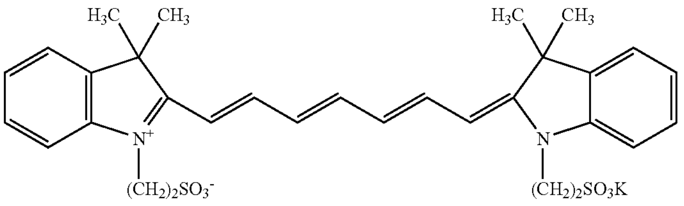

(IR-2)

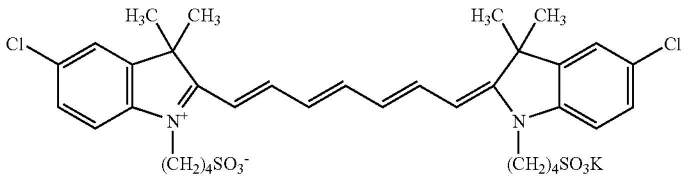

(IR-3)

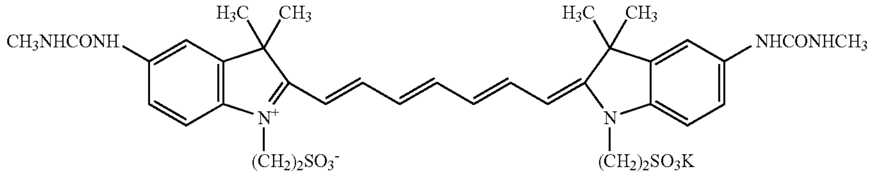

(IR-4)

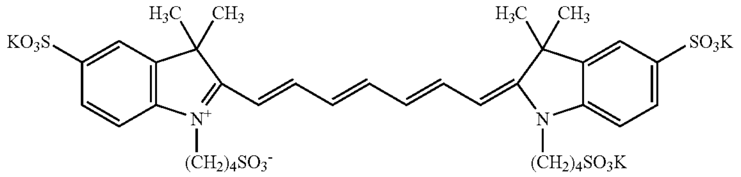

-continued (IR-5)

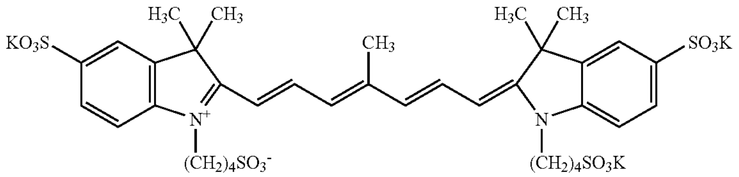

(IR-6)

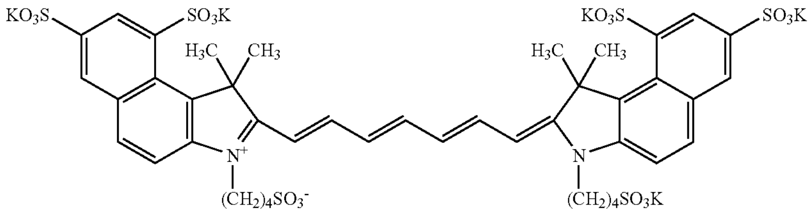

(IR-7)

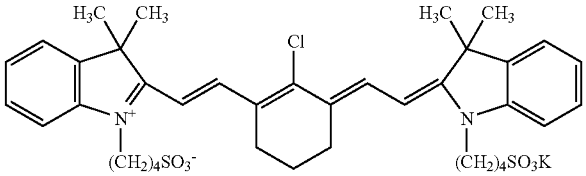

(IR-8)

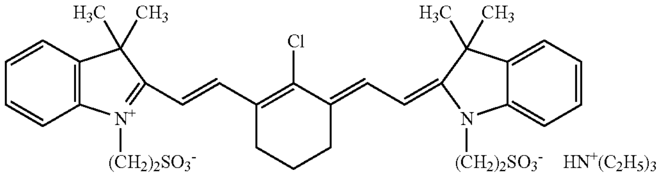

(IR-9)

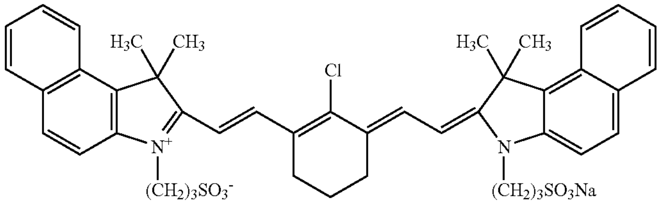

(IR-10)

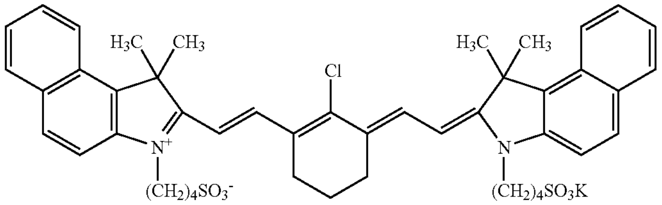

(IR-11)

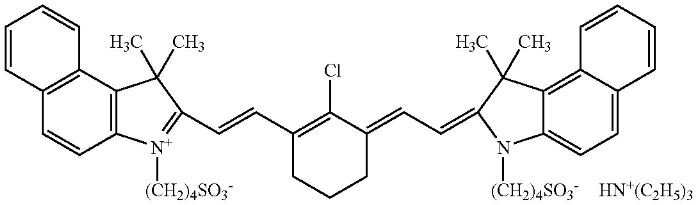

The content by percentage of the photothermal conversion agent is to be an amount which suffices to cause the vicinity of the heat-meltable hydrophobic particles or the water-dispersible particles to be melted and adhered by heat generated as a result of light absorption of the photothermal conversion agent, to make the particles hydrophobic, and the content can be selected from a wide range of 2 to 50% by mass of all solid constituents. If the amount is less than 2% by mass, the amount of the generated heat is insufficient so that the sensitivity tends to deteriorate. If the amount is 50% by mass or more, there is a possibility that the film strength lowers, in particular, when the used photothermal conversion agent is a solid agent such as pigment.

[Other Components]

In the planographic printing plate precursor of the present embodiment, there are used, as its image-recording component, particles of a compound (B) capable of forming a hydrophobic surface area by being heated or irradiated with a radiation, typical examples of which include the heat-meltable hydrophobic particles and water-dispersible particles contained in the hydrophilic layer, and then these particles are melted and adhered in the exposed portions so that hydrophobic areas are formed. For various purposes such as improvement in the sensitivity and the physical strength of the recording layer, improvement in the dispersibility of the components constituting the respective layer and the coating property thereof, improvement in the printability of the precursor, and convenience of plate-making workability, it is acceptable to add, to the hydrophilic layer, known additives, inorganic fine particles, hydrophilic polymer compounds, surfactants, colorants, and other compounds as far as the effect of the invention is not damaged. These will be described hereinafter.

(Surfactant)

The surfactant which is used in the hydrophilic layer may be the same surfactant as can be used in the production of the water-dispersible particles.

In order to disperse components of the recording layer, the following surfactants, as well as the above-mentioned surfactants, can be preferably used: surfactants having a perfluoroalkyl group, anionic surfactants having any one of carboxylic acid, sulfonic acid, sulfate, and phosphate groups, cationic surfactants such as aliphatic amines and tertiary ammonium salts, betaine-type amphoteric surfactants, and nonionic surfactants such as aliphatic esters of polyoxy compounds, polyalkylene oxide condensed type surfactants and polyethylene imine condensed type surfactants.

The ratio of the above-mentioned surfactant in all solid contents in the recording layer is preferably from 0.05 to 15%, more preferably from 0.1 to 5% by mass.

(Colorant)

In the hydrophilic layer having an image-recording function in the present embodiment, a dye exhibiting a large absorption in the visible light range can be used as a colorant of image in order to distinguish image portions and non-image portions clearly after images are formed. Specific examples thereof include Oil Yellow #101, Oil Yellow #103, Oil Pink #312, Oil Green BG, Oil Blue BOS, Oil Blue #603, Oil Black BY, Oil Black BS, and Oil Black T-505, each of which is manufactured by Orient Chemical Industries, Ltd.; and Victoria Pure Blue, Crystal Violet (CI42555), Methyl Violet (CI42535), Ethyl Violet, Rohdamine B (CI14517), Malachite Green (CI42000), Methylene Blue (CI52015), and dyes described in JP-A No. 62-293247. Phthalocyanine pigments, azo pigments, titanium oxide and other pigments can also be preferably used. The amount thereof to be added is from 0.01 to 10% by mass of all solid contents in the hydrophilic layer.

[Heat Insulating Layer]

In the planographic printing plate precursor of the present embodiment, it is preferred to form a heat insulating layer between the support and the hydrophilic layer having an image-recording function. The heat insulating layer will be described hereafter.

The heat insulating layer formed as an underlying layer of the hydrophilic layer is a layer having a low heat conductivity and having a function of suppressing thermal diffusion into the support. The heat insulating layer can contain a photothermal conversion agent. In this case, this agent contributes to improving the recording sensitivity when the agent generates heat by irradiation with light and faciliattes the compound (B) contained in the hydrophilic layer to form a hydrophobic surface area. Such a heat insulating layer contains an organic or inorganic resin.

The organic or inorganic resin which can be used in the heat insulating layer can be selected from a wide range of hydrophilic or hydrophobic resins. Examples of the hydrophobic resin include polyethylene, polypropylene, polyester, polyamide, acrylic resin, vinyl chloride resin, vinylidene chloride resin, polyvinyl butyral resin, nitrocellulose, polyacrylate, polymethacrylate, polycarbonate, polyurethane, polystyrene, vinyl chloride/vinyl acetate copolymer, vinyl chloride/vinyl acetate/vinyl alcohol copolymer, vinyl chloride/vinyl resin/maleic acid copolymer, vinyl chloride/acrylate copolymer, polyvinylidene chloride, and vinylidene chloride/acrylonitrile copolymer.

In this heat insulating layer, the hydrophobic resin can also be used in the form of an aqueous emulsion. The aqueous emulsion is a hydrophobic polymer suspended aqueous solution in which fine resin particles and an optional protecting agent for dispersing and stabilizing the particles are dispersed in water.

Specific examples of the aqueous emulsion which can be used include vinyl polymer latexes (such as polyacrylate type, vinyl acetate type, and ethylene/vinyl acetate type latexes), conjugated diene polymer latexes (such as methyl methacrylate/butadiene type, styrene/butadiene type, acrylonitrile/butadiene type, and chloroprene type latexes), and polyurethane resin.

Specific examples of the hydrophilic resin include polyvinyl alcohol (PVA), modified PVAs such as carboxy-modified PVA, starch and derivatives thereof, cellulose derivatives such as carboxymethylcellulose, hydroxyethylcellulose, ammonium alginate, polyacrylic acid, polyacrylic acid salts, polyethylene oxide, water-soluble urethane resin, water-soluble polyester resin, polyhydroxyethyl acrylate, polyethylene glycol diacrylate type polymer, N-vinylcarboxylic acid amide polymer, casein, gelatin, polyvinyl pyrrolidone, vinyl acetate/crotonic acid copolymer, styrene/maleic acid copolymer, and other water-soluble resins.

When the above-mentioned hydrophilic resin is used in the heat insulating layer, it is preferred from the viewpoint of improving film properties of the layer that the resin is crosslinked and cured to be used. As a crosslinking agent for the crosslinking, a known crosslinking agent adapted for the used hydrophilic resin can be appropriately used.

The inorganic resin used in the heat insulating layer is preferably made of an inorganic matrix formed by sol-gel conversion. The system which can be preferably used in the present embodiment and can attain sol-gel conversion is a polymer in which bonding groups bonded to multivalent elements form a network structure through oxygen atoms, the polyvalent elements also have non-bonded hydroxyl groups and alkoxy groups, and these are mixed to make a resin-like structure. When the alkoxy groups and the hydroxyl groups are present in a relatively large amount, the system is in a sol state. With the advance of dehydrating condensation, the network resin structure becomes firmer.

The inorganic resin has a nature that the degree of hydrophilicity of the resin texture thereof changes, that is, the degree of hydrophilicity thereof changes as result of bonding of a part of the hydroxyl group to the solid fine particles and modifying the surfaces of solid fine particles. Examples of the polyvalent bonding element of the compound having the hydroxyl groups or alkoxy groups which can attain sol-gel conversion include aluminum, silicon, titanium, and zirconium. These elements can be used in the present embodiment.

In particular, the resin which constitutes the heat insulating layer is preferably the hydrophilic resin from the viewpoint of the adhesion to the hydrophilic layer having an image-forming function.

When a photothermal conversion agent is incorporated into the heat insulating layer, it is possible to use, as the photothermal conversion agent, the same photothermal conversion agent as used in the above-mentioned hydrophilic layer.

The content by percentage of the photothermal conversion agent in the heat insulating layer can be set in a wide range of 2 to 95% by mass of solid constituents in the layer. If the content is 2% or less by mass, the amount of generated heat is insufficient and the effect by the addition thereof is not recognized. If the content is 95% or more by mass, the film strength lowers.

Compounds of various functions such as inorganic fine particles and a surfactant, as well as the above-mentioned resin and the photothermal conversion agent, can be added to the heat insulating layer in order to improve the physical strength of the heat insulating layer, the dispersibility of the components which constitute the layer with respect to each other, the coating property thereof, and the adhesion of the heat insulating layer to the hydrophilic layer having an image-recording function, and other properties.

(Inorganic Fine Particles)

Preferred examples of the inorganic fine particles which can be added to the heat insulating layer include particles of silica, alumina, magnesium oxide, titanium oxide, magnesium carbonate, calcium alginate, and mixtures thereof. Even if these particles do not have photothermal convertibility, they contribute to the reinforcement of the film, the reinforcement of the interfacial adhesion, by making the surface rough, and by other effects.

The average particle size of the inorganic fine particles is preferably from 5 nm to 10 μm, more preferably from 10 nm to 1 μm. If the average particle size is within this range, the water-dispersible particles and metal particles of the photothermal conversion agent are stably dispersed in the binder resin so that the film strength of the heat insulating layer is sufficiently kept. As a result, non-image portions which do not attract printing stains easily and are superior in hydrophilicity can be formed.

Such inorganic fine particles can easily be obtained as commercially available colloidal silica dispersion, and others.

The content by percentage of the inorganic fine particles in the heat insulating layer is preferably from 1.0 to 70%, more preferably from 5.0 to 50% by mass of all solid contents in the heat insulating layer.

[Water-Soluble Protective Layer]

The hydrophilic layer surface of the planographic printing plate precursor of the invention, the surface having an image-recording function, is hydrophilic; therefore, when the precursor is transported or stored in the form of a manufactured product or is handled before practical use thereof, the hydrophilic layer surface could be made hydrophobic by effect of the environmental atmosphere, affected by temperature and humidity, or affected by mechanical injuries or stains. In order to prevent this, it is preferred to form a water-soluble surface protective layer which is made mainly of water-soluble polymer in the present planographic printing plate precursor.

Since the water-soluble protective layer is dissolved or removed by moistening water at the initial stage of printing, the step of removing the layer is unnecessary and the layer does not cause any deterioration of the on-machine developability of the precursor.

The following will describe components contained in the water-soluble protective layer.

The water-soluble protective layer contains a water-soluble polymer. This functions as a binding resin (layer-forming component) for the water-soluble protective layer. Examples of the water-soluble polymer include polymers which sufficiently contain hydrophilic functional groups such as a hydroxyl group, a carboxyl group, and a basic nitrogen containing group.

Specific examples of the polymer include polyvinyl alcohol (PVA), modified PVAs such as carboxy-modified PVS, gum arabic, water-soluble soybean polysaccarides, polyacrylamide and copolymer thereof, acrylic acid copolymer, vinyl methyl ether/maleic anhydride copolymer, vinyl acetate/maleic anhydride copolymer, styrene/maleic anhydride copolymer, roasted dextrin, enzyme-decomposed dextrin, enzyme-decomposed etherified dextrin, starch and derivatives thereof, cellulose derivatives such as carboxymethylcellulose, carboxyethylcellulose, methylcellulose and hydroxyethylcellulose, casein, gelatin, polyvinyl pyrrolidone, vinyl acetate/crotonic acid copolymer, styrene/maleic acid copolymer, alginic acid and alkali metal salts, alkali earth metal salts and ammonium salts thereof, polyacrylic acid, poly(ethylene oxide), water-soluble urethane resin, water-soluble polyester resin, polyhydroxyethyl acrylate, polyethylene glycol, polypropylene glycol, and N-vinylcarboxylic acid amide polymer.

Particularly preferred are polyvinyl alcohol (PVA), modified PVAs such as carboxy-modified PVS, gum arabic, polyacrylamide, polyacrylic acid, acrylic acid copolymer, polyvinyl pyrrolidone, and alginic acid and alkali metal salts thereof. These may be used alone or in the form of a mixture of two or more thereof dependently on purpose.

The content by percentage of the water-soluble polymer in the water-soluble protective layer coating-solution is generally from 3 to 25% by mass, preferably 10 to 25% by mass.

The water-soluble protective layer may contain various surfactants as well as the above-mentioned water-soluble polymer. The surfactants which can be used are anionic surfactants or nonionic surfactants, and are the same as used in the hydrophilic layer. The content by percentage of the surfactant is preferably from 0.01 to 1%, more preferably from 0.05 to 0.5% by mass of all solid contents in the water-soluble protective layer.

If necessary, this protective layer coating-solution may contain, as a wetting agent, a lower polyhydric alcohol such as glycerin, ethylene glycol or triethylene glycol besides the above-mentioned components. The use amount of the wetting agent is generally from 0.1 to 5.0%, preferably from 0.5 to 3.0% by mass of the protective layer.

A preservative or the like can be added to the protective layer containing-solution. For example, benzoic acid, a derivative thereof, phenol, formalin, sodium dehydroacetate or some other compound can be added in an amount of 0.005 to 2.0% by mass.

An antifoaming agent may be added to the coating-solution. Preferred examples of the antifoaming agent include organic silicone compounds. The adding amount thereof is preferably from 0.0001 to 0.1% by mass.

A photothermal conversion agent may be added to the water-soluble protective layer. In this case, the sensitivity of the thermal melting/adhering, during on irradiation with light, of the particles in the hydrophilic layer having an image-recording function is more improved. Thus, preferred results can be obtained. Such photothermal conversion agent as is used in the heat insulating layer can be used in the water-soluble protecting layer. A preferred amount thereof to be added is also the same as that in the heat insulating layer.

[Support]

The following will describe a support on or over which the hydrophilic layer having an image-recording function is deposited.

As the support, a dimensionally stable plate is used. Examples of the support which can be used in the present embodiment include papers, plastic (such as polyethylene, polypropylene or polystyrene)-laminated papers, metal plates (such as aluminum, zinc, copper, nickel and stainless steel plates), plastic films (such as cellulose biacetate, cellulose triacetate, cellulose propionate, cellulose lactate, cellulose acetate lactate, cellulose nitrate, polyethylene terephthalate, polyethylene, polystyrene, polypropylene, polycarbonate, and polyvinyl acetate films), and papers or plastic films on which a metal as described above is laminated or vapor-deposited.

The support is preferably a polyester film, an aluminum plate or a SUS steel plate, which does not corrode easily in a planographic printing plate precursor, and is more preferably an aluminum plate since it has superior in dimensional stability and is relatively inexpensive.

Preferred examples of the aluminum plate include a pure aluminum plate and alloy plates made of aluminum as the main component and a very small amount of different elements. A plastic film on which aluminum is laminated or vapor-deposited may be used. The different elements contained in the aluminum alloys are silicon, iron, manganese, copper, magnesium, chromium, zinc, bismuth, nickel, titanium and so on. The content by percentage of the different elements in the alloy is to be at most 10% by mass. A particularly preferred aluminum plate in the present embodiment is a pure aluminum plate; however, a very small amount of the different elements may be contained in the plate since completely pure aluminum cannot be easily produced from the viewpoint of refining technique. In short, the aluminum plate used in the present embodiment is not specific in the composition thereof. Thus, conventional aluminum plates which have been known or used hitherto can be used.

The thickness of the support used in the present embodiment is from about 0.05 to 0.6 mm, preferably from 0.1 to 0.4 mm, and most preferably from 0.15 to 0.3 mm.

The aluminum plate may be subjected to surface-roughening treatment. Specifically, if desired, the aluminum plate is subjected to degreasing treatment, for example, with a surfactant, an organic solvent or an alkaline aqueous solution in order to remove rolling oil on the surface before the surface-roughening treatment.

The roughening treatment of the aluminum plate surface is performed by various methods, examples of which include a mechanically surface-roughening method, a method of dissolving and roughening the surface electrochemically, and a method of dissolving the surface selectively in a chemical manner. The mechanically surface-roughening method which can be used may be a known method, such as a ball polishing method, brush polishing method, a blast polishing method or a buff polishing method. The chemical (i.e., selective dissolution) method is a method of immersing the aluminum plate into an aqueous saturated solution of an aluminum salt of a mineral acid, as described in JP-A No. 54-31187. The electrochemically surface-roughening method may be a method of performing surface-roughening in an electrolyte which contains an acid such as hydrochloric acid or nitric acid by alternating current or direct current. Further, as disclosed in JP-A No. 54-63902, an electrolyzing surface-roughening method using a mixed acid can also be used.

Among such surface-roughening methods, preferred is a surface-roughening method of combining the mechanical surface-roughening and the electrochemical surface-roughening as described in JP-A No. 55-137993, since the adhesive strength of oil-sensitive images to the support is large.

The surface-roughening by the above-mentioned method is preferably performed in such a manner that the center line surface roughness (Ra) of the surface of the aluminum plate will be from 0.3 to 1.0 μm.

The aluminum plate the surface of which is roughened is subjected to alkali-etching treatment with an aqueous solution of potassium hydroxide, sodium hydroxide or the like, and neutralizing treatment, if necessary. Thereafter, the aluminum plate is subjected to anodizing treatment if desired, in order to improve the wear resistance.

The electrolyte used in the anodizing treatment of the aluminum plate may be any one selected from various electrolytes which can form a porous oxide film in the aluminum plate. Examples of the electrolyte generally used include sulfuric acid, phosphoric acid, oxalic acid, chromic acid, or a mixed acid thereof. The concentration of the electrolyte may be appropriately decided depending on the type of the electrolyte.

Treatment conditions for the anodization cannot be fixed since the conditions vary depending on the used electrolyte; however, the following conditions are generally suitable: an electrolyte concentration of 1 to 80% by mass, a solution temperature of 5 to 70° C., a current density of 5 to 60 $A/dm^2$, a voltage of 1 to 100 V, and an electrolyzing time of 10 seconds to 5 minutes.

The amount of the formed oxide film is preferably from 1.0 to 5.0 $g/m^2$, more preferably from 1.5 to 4.0 $g/m^2$. If the amount is less than 1.0 $g/m^2$, the printing resistance is insufficient or injuries are easily generated.

Particularly preferred among these anodizing treatments are a method of performing anodization at a high current density in sulfuric acid, described in GB Patent No. 1,412,768, and a method of performing anodization in phosphoric acid as an electrolyzing bath, described in U.S. Pat. No. 3,511,661.

[Plate-Making and Printing]

In the planographic printing plate precursor of the present embodiment, an image is formed by heat. Specifically, there is used direct image recording by means of a thermal recording head, exposure to a scanning infrared laser, exposure to high-illumination flash from a xenon discharge lamp, exposure to light from an infrared lamp, or some other operation. Preferred is exposure to a semiconductor laser emitting infrared rays having a wavelength of 700 to 1200 nm, or a solid high-power infrared ray laser such as YAG laser.

The planographic printing plate precursor of the present embodiment can be irradiated with a laser having a laser power of 0.1 to 300 W. When a pulse laser is used, it is preferred to radiate a laser having a peak power of 1000 W, preferably 2000 W. About the exposure amount in this case, the surface exposure intensity before the light is modulated by printing-image signals is preferably from 0.1 to 10 J/$cm^2$, preferably from 0.3 to 1 J/$cm^2$.

When the support is transparent, the hydrophilic layer (i.e., the recording layer) can be exposed to light, through the support, from the back side of the support.

In the exposed areas, the particles of the compound capable of forming hydrophobic surface areas by being heated or irradiated with a radiation, for example, the water-dispersible particles dispersed in the hydrophilic layer are melted and adhered to each other to form hydrophobic areas. This compound has a hydrophilic surface and has, in a preferred embodiment, an organic silicon group for generating interaction with an element, such as silicon, in the alkoxide compound in the hydrophilic layer. Thus, the compound adheres closely to the hydrophilic layer on one side, thereby forming ink-receiving areas (i.e., image portions) on the other side. In non-exposed areas, the hydrophobic particles having surface hydrophilicity, such as the water-dispersible particles, are easily removed even by a little water so that the hydrophilic layer is naked. As a result, the hydrophilic layer, which has a crosslinked structure, acts as moistening water receiving areas having high hydrophilicity, serving as the non-exposed portions.

In the imagewise-exposed planographic printing plate precursor of the present embodiment, components in the non-exposed portions are removed even by a little water; therefore, the precursor can be fitted to a printing machine without being subjected to any especial treatment, such as developing treatment with a liquid developing solution, so that only ink and moistening water suffice to attain printing by usual procedure.

The present planographic printing plate precursor is set on a printer cylinder, and exposed to a laser from a laser device mounted on the printer. Thereafter, in the state that the precursor is set as it is, ink and moistening water are used to print an image on the precursor by usual procedure.

Since the planographic printing plate precursor in the present embodiment has a hydrophilic layer superior in endurance and hydrophilicity, a great number of printed matters having superior image quality, in which their non-image portions are not stained, can be produced even under severe printing conditions.

EXAMPLES

The present invention will be described in more detail by the following examples hereinafter. However, the invention is not limited to these examples.

[Synthesis of a Specific Hydrophilic Polymer (1-1)]

Into a 500-mL three-neck flask were put 50 g of acrylamide, 3.4 g of mercaptopropyltrimethoxysilane and 220 g of dimethylacetoamide, and then 0.5 g of 2,2-azobis(2,4-dimethylvaleronitrile) was added thereto under nitrogen flow at 65° C. This temperature was kept while the solution was stirred for 6 hours. Thereafter, the reaction system was cooled to room temperature. The solution was poured into 2 L of ethyl acetate. The precipitated solid was filtrated off, and washed with water to yield a hydrophilic polymer (1). The mass of the polymer after being dried was 52.4 g. GPC (polystyrene standard) demonstrated that the resultant polymer had a weight average molecular weight of 3000, and $^{13}$C-NMR (DMSO-d6) demonstrated that the polymer was a polymer (1-1) having the structure of the exemplified compound 1 and having, at its terminal, a trimethoxysilyl group (50.0 ppm).

[Synthesis of Water-Dispersible Particles 1 to 10]

Synthesis Example 1

As an oil phase component, the following solution was prepared: a solution of 30.0 g of a hydrophobic polymer (PI-1 described in the present specification), 45.0 g of MEK, and 0.5 g of an anionic surfactant Pionine A41C (manufactured by Takemoto Oil & Fat). As a water phase component, the following solution was prepared: a solution of 4.2 g of a water-soluble resin (WII-1 described in the present specification), and 259.8 g of water. The two were mixed, and then stirred and mixed vigorously at 12,000 rpm in a homogenizer for 10 minutes. In this way, an emulsified dispersion in which oil droplets were dispersed in the water phase was yielded. Next, the emulsified dispersion was charged into a stainless steel pot, and stirred at 40° C. for 3 hours to remove the solvent components, thereby yielding water-dispersible particles 1 having an average particle size of 0.24 μm.

Synthesis Example 2

As an oil phase component, the following solution was prepared: a solution of 30.0 g of a hydrophobic polymer (PI-1 described in the present specification), 45.0 g of MEK, and 0.5 g an anionic surfactant Pionine A41C (manufactured by Takemoto Oil & Fat). As a water phase component, the following solution was prepared: a solution of 60 g of a SNOWTEX C (manufactured by Nissan Chemical Industries, Ltd.), and 259.8 g of water. The two were mixed, and then stirred and mixed vigorously at 12,000 rpm in a homogenizer for 10 minutes. In this way, an emulsified dispersion in which oil droplets were dispersed in the water phase was yielded. Next, the emulsified dispersion was charged into a stainless steel pot, and stirred at 40° C. for 3 hours to remove the solvent components, thereby yielding water-dispersible particles 2 having an average particle size of 0.21 μm.

Synthesis Examples 3 to 10

Water-dispersible particles 3 to 10 were synthesized in the same way as in Synthesis Example 1 or 2 except that the hydrophobic polymer, the water-soluble resin, the oxide particles, the surfactant used in Synthesis Example 1 or 2 were replaced by raw materials described in Table 1, respectively.

The water-dispersible particles obtained in Synthesis Examples 1 to 10 did not include any photothermal conversion agent, as is clear from the raw materials thereof.

TABLE 1

| Synthesis Example of water-dispersible particles | Hydro-phobic polymer | Oxide particles | Water-soluble resin | Surfactant | Average particle size (μm) |
|---|---|---|---|---|---|
| 3 | PI-1 | — | WII-2 | Pionine A41C | 0.327 |
| 4 | PI-2 | SNOWTEX C | | Pionine A41C | 0.21 |
| 5 | PI-4 | — | WII-2 | Pionine A41C | 0.35 |
| 6 | PI-1 | Titania sol | | Pionine A41C | 0.22 |
| 7 | PI-1 | Alumina sol | | Pionine A41C | 0.27 |
| 8 | PI-1 | Emarl NC | WII-1 | Pionine A41C | 0.20 |
| 9 | PI-1 | Titania sol | WII-1 | Pionine A41C | 0.38 |
| 10 | PI-3 | Alumina sol | WII-1 | Emarl NC | 0.35 |

Details of the materials and product described in the are as follows:

Titania sol: STS-01 manufactured by Ishihara Sangyo Kaisha, Ltd.

Alumina sol: Alumina sol 520 manufactured by Nissan Chemical Industries, Ltd.

Emarl NC: anionic surfactant manufactured by Kao Corporation

Synthesis Example 11

As an oil phase component, the following solution was prepared: a solution of 4 g of cellulose acetate propionate, 1.5 g of an infrared ray absorbing dye I, and 38 mL of dichloromethane. As a water phase component, the following solution was prepared: a solution of 30 mL of Rudox colloidal silica manufactured by Dupont Co. Ltd., 3 mL of a methylaminoethanol/adipic acid copolymer, and a phthalic acid buffer solution (pH: 4). The two were mixed, and then stirred and mixed vigorously at 12,000 rpm in a homogenizer for 10 minutes. In this way, an emulsified dispersion in which oil droplets were dispersed in the water phase was yielded. Next, the emulsified dispersion was charged into a stainless steel pot, and stirred at 40° C. for 3 hours to remove the solvent components, thereby yielding water-dispersible particles 11 having an average particle size of 0.30 μm and including the infrared ray absorbing dye.

Infrared Ray Absorbing Dye I

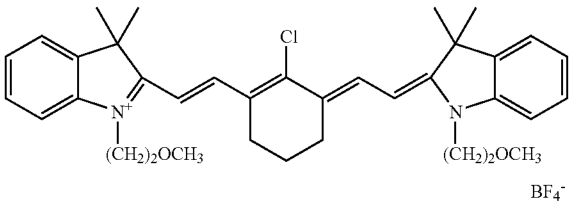

Examples 1 to 10 and Comparative Example 1

Examples 1 to 10

(Formation of a Hydrophilic Layer)

The following components were mixed in a homogeneous form and stirred at room temperature for 2 hours to conduct hydrolysis, thereby yielding a sol hydrophilic coating-solution composition 1.

(Hydrophilic Coating-Solution Composition 1)

| | |
|---|---|
| specific hydrophilic polymer (1-1) | 21 g |
| tetramethoxysilane [crosslinking component] | 62 g |
| ethanol | 470 g |
| water | 470 g |
| aqueous nitric acid solution (1 N) | 10 g |

(Formation of an Image Forming Layer)

Thereafter, the hydrophilic coating-solution composition 1 was used to prepare the following hydrophilic layer forming coating-solution 1 having image forming ability. The coating-solution 1 was applied onto a corona-treated polyethylene terephthalate film support in such a manner that the amount of the applied solution after being dried would be 3 $g/m^2$. The resultant was heated and dried at 100° C. for 10 minutes to yield a planographic printing plate precursor 1.

(Hydrophilic Layer Forming Coating-Solution 1)

| | |
|---|---|
| the above-mentioned hydrophilic coating-solution composition 1 | 660 g |
| each of water-dispersible particles 1 to 10 (10% by mass) | 200 g |
| infrared ray absorbing dye II (the following compound) | 5 g |

Infrared Ray Absorbing Dye II

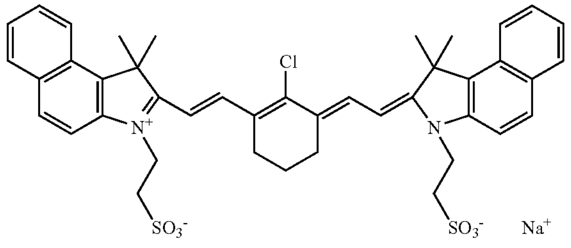

Comparative Example 1

(Formation of an Image Forming Layer)

The hydrophilic coating-solution composition 1 was used to prepare the following hydrophilic layer forming coating-solution 2 having image forming ability. The coating-solution 1 was applied onto a corona-treated polyethylene terephthalate film support in such a manner that the amount of the applied solution after being dried would be 3 $g/m^2$. The resultant was heated and dried at 100° C. for 10 minutes to yield a planographic printing plate precursor 11.

(Hydrophilic Layer Forming Coating-Solution 2)

| | |
|---|---|
| the above-mentioned hydrophilic coating-solution composition 1 | 660 g |
| water-dispersible particles 11 (10% by mass) | 200 g |

[Evaluation of the Planographic Printing Plate Precursors]

The contact angles (of a water droplet in the air) with respect to the surfaces of the resultant hydrophilic layers, having image forming ability, on the supports were measured with a measuring device CA-Z manufactured by Kyowa Interface Science Co., Ltd. The contact angles were from 7 to 9°, and it was proved that all of the precursors had superior hydrophilic.

Each of the resultant planographic printing plate precursors 1 was exposed to a laser from a Trend setter 3244 VFS manufactured by CREO, on which a water-cooling type 40 W infrared ray semiconductor laser device was mounted, under the following conditions: an outside surface drum rotation number of 100 rpm, a printing plate energy of 500 mL/$cm^2$, and a resolution of 2400 dpi. In this way, image areas were formed on the exposed surface.

The contact angles (of a water droplet in the air) with respect to the exposed surfaces were measured with a measuring device CA-Z manufactured by Kyowa Interface Science Co., Ltd. The contact angles were raised to 90 to 115°, and it was proved that hydrophobic areas (ink-receiving areas) were formed.

After the exposure, each of the planographic printing plate precursors was set on the following printer without being developed, and was used for printing.

The used printer was a printer SOR-M manufactured by Heidelberg Co. Ltd. As moistening water, an IF 201 (2.5%) or IF 202 (0.75%), which was manufactured by Fuji Photo Film Co., Ltd., was used. As ink, a GEOS sumi (trade name, manufactured by Dainippon Ink and Chemicals, Incorporated) was used. At the initial stage of the printing process, high-quality printed matters were immediately obtained in each case. Thereafter, the printing was continued. The number of the printed matters just before the image portions started to get faint and patchy was defined as printing resistance number. As the printing resistance number is larger, the printing resistance is better. The results are shown in Table 2 together with the contact angles of the image portion surface and the non-image portion surface.

TABLE 2

| | Contact angle value | | Printing resistance |
|---|---|---|---|
| | Non-image portions | Image portions | number |
| Example 1 | 8° | 110° | 20,000 |
| Example 2 | 8° | 105° | 19,000 |
| Example 3 | 7° | 90° | 16,000 |
| Example 4 | 9° | 115° | 18,000 |
| Example 5 | 8° | 110° | 17,000 |
| Example 6 | 8° | 108° | 19,000 |
| Example 7 | 7° | 95° | 22,000 |
| Example 8 | 8° | 103° | 21,000 |
| Example 9 | 6° | 90° | 17,000 |
| Example 10 | 8° | 109° | 18,000 |
| Comparative Example 1 | 7° | 100° | 10,000 |

As is evident from Table 2, the planographic printing plate precursors of the invention were superior in both of the hydrophobicity of the image portions and the hydrophilicity of the non-image portions. Moreover, these gave high image quality printed matters, without being subjected to any development, immediately at the initial stage of the printing process, and further realized high printing resistance.

On the other hand, the planographic printing plate precursor of Comparative Example 1, (using the water-dispersible particles 11, in which the dye which was a photothermal conversion agent was included in the compound capable of forming a hydrophobic surface area by being heated or irradiated with a radiation) was printed without being developed, so as to give high image quality printed matters immediately at the initial stage of the printing process. However, it was understood that by continuing the printing process, image portions were partially peeled to exhibit poorer printing resistance than respective Examples.

[Second Embodiment]

The planographic printing plate precursor according to the second aspect of the invention will be described in detail by way of the following second embodiment.

As described above, the planographic printing plate precursor of the second aspect of the invention is a planographic printing plate precursor comprising a support, and a hydrophilic layer which is formed on or over the support and comprises water-dispersible particles that can be yielded by copolymerization of a hydrophilic macro-monomer and a hydrophobic monomer and are capable of forming a hydrophobic surface area by being heated or irradiated with a radiation.

First, the specific water-dispersible particles contained in the hydrophilic layer, which are particles of the most important constituent in the present aspect, will be described.

[Water-Dispersible Particles that can be Yielded by Copolymerization of a Hydrophilic Macro-Monomer and a Hydrophobic Monomer and are Capable of Forming a Hydrophobic Surface Area by being Heated or Irradiated with a Radiation]

The specific water-dispersible particle according to the present embodiment is a core-corona type fine particle as follows: hydrophilic macro-monomer chains are bonded to each other, in a radiant form (in a corona form), to form the outer-side of the particle; and a hydrophobic monomer is polymerized to form a nucleus (i.e., a core) at the inner side of the particle.

(Hydrophilic Macro-Monomer)

In the invention, the type of the hydrophilic macro-monomer used in the synthesis of the specific water-dispersible particles is not particularly limited as long as the macro-monomer has a hydrophilic group and can be copolymerized with the hydrophobic monomer, which will be detailed later, and form the core-corona type particles.

Specific examples thereof include amide-based macro-monomers derived from acrylic acid, acrylamide or methacrylamide, macro-monomers derived from carboxyl group-containing monomers such as methacrylic acid, sulfonic acid based macro-monomers derived from 2-acrylamide-2-methylpropanesulfonic acid, vinylstyrenesulfonic acid and salts thereof, amide-based macro-monomers derived from n-vinylcarboxyl acid amide monomers such as N-vinylacetoamide and N-vinylformamide, macro-monomers derived from hydroxyl group-containing monomers such as hydroxyethyl methacrylate, hydroxyethyl acrylate, glycerol monomethacrylate, and macro-monomers derived from alkoxy group-containing or ethylene oxide group-containing monomers such as methoxyethyl acrylate, methoxypolyethylene glycol acrylate and polyethylene glycol acrylate. Other examples thereof include monomers having a polyethylene glycol chain or a polyproplylene glycol chain.

Preferred among these examples are macro-monomers derived from acrylic acid, 2-acrylamide-2-methylpropanesulfonic acid, vinylstyrenesulfonic acid, acrylamide, N-vinylacetoamide and polyethylene glycol acrylate. Particularly preferred are macro-monomers derived from acrylic acid, 2-acrylamide-2-methylpropanesulfonic acid and acrylamide.

The molecular weight of the hydrophilic macro-monomer useful for the invention is preferably from 400 to 100000, more preferably from 1000 to 50000, and most preferably from 1500 to 20000. If the molecular weight is 400 or less, the water-dispersibility of the resultant particles is insufficient. If the molecular weight is 100000 or more, the macro-monomer has poor copolymerizability with the hydrophobic monomer which will make a core.

(Hydrophobic Monomer)

The type of the hydrophobic monomer according to the invention is not particularly limited as long as the monomer is hydrophobic and can be copolymerized with the hydrophilic macro-monomer and form core-corona type particles. Specific examples thereof include hydrophobic monomers described in the following (A) to (G):

(A) acrylic acid esters, examples of which include acrylic acid esters which may have a substituent, such as methyl acrylate, ethyl acrylate, propyl acrylate, butyl acrylate, amyl acrylate, hexyl acrylate, cyclohexyl acrylate, octyl acrylate, phenyl acrylate, benzyl acrylate, 2-chloroethyl acrylate, 2-hydroxyethyl acrylate, 4-hydroxybutyl acrylate, glycidyl acrylate, N-dimethylaminoethyl acrylate, o-, m- and p-hydroxyphenyl acrylate, (B) methacrylic acid esters, examples of which include methacrylic acid esters which may have a substituent, such as methyl methacrylate, ethyl methacrylate, propyl methacrylate, butyl methacrylate, amyl methacrylate, hexyl methacrylate, cyclohexyl methacrylate, octyl methacrylate, phenyl methacrylate, benzyl methacrylate, 2-chloroethyl methacrylate, 2-hydroxyethyl methacrylate, 4-hydroxybutyl methacrylate, glycidyl methacrylate, N-dimethylaminoethyl methacrylate, o-, m- and p-hydroxyphenyl methacrylate, (C) vinyl ethers, examples of which include ethyl vinyl ether, 2-chloroethyl vinyl ether, hydroxyethyl vinyl ether, propyl vinyl ether, butyl vinyl ether, octyl vinyl ether, and phenyl vinyl ether, (D) vinyl esters, examples of which include vinyl acetate, vinyl chloroacetate, vinyl butyrate, and vinyl benzoate, (E) syrenes, examples of which include styrene, α-methylstyrene, methylstyrene, chloromethylstyrene, and o-, m- and p-hydroxystyrene, (F) vinyl ketones, examples of which include methyl vinyl ketone, ethyl vinyl ketone, propyl vinyl ketone, and phenyl vinyl ketone, and (G) olefins, examples of which include ethylene, propylene, isobutylene, butadiene, and isoprene.

Among the above-mentioned hydrophobic monomers, preferred monomers are methyl acrylate, ethyl acrylate, propyl acrylate, methyl methacrylate, ethyl vinyl ether, vinyl acetate and styrene. Particularly preferred are methyl acrylate, ethyl acrylate and styrene.

(Synthesis of the Specific Water-Dispersible Particles)

One of the methods of synthesizing the specific water-dispersible particles according to the invention is a method of copolymerizing the hydrophilic macro-monomer with the hydrophobic monomer in a solvent which will be detailed later. By the copolymerization of the hydrophilic macro-monomer with the hydrophobic monomer in the solvent, chains of the hydrophilic macro-monomer which have affinity with the solvent are arranged in a well-ordered manner outside of the particles so that the chains are bonded, in a radiating form (corona form), to form the outer side of the particles. On the other hand, inside the particles, the hydrophobic monomer is polymerized to form nuclei (cores). In this way, core-corona type particles according to the invention can be obtained. Details thereof are described in known publications such as Polymer Journal, 24, 959 (1992), M. Akashi et al., Journal of Polymer Science, 31, 1153 (1993), and JP-A No. 2-296813, and JP-A No. 2-296808.

The type of the solvent used in the copolymerization of the hydrophilic macro-monomer with the hydrophilic monomer is not particularly limited, and examples thereof include water, methanol, ethanol, 2-propanol, acetone, tetrahydrofuran, acetonitrile, and methyl ethyl ketone. If necessary, these solvents may be used in a mixture form.

The following will describe synthesis examples of such specific water-dispersible particles. In the invention, however, the synthesis method of the particles is not limited to these examples.

<Synthesis Example of Specific Water-Dispersible Particles 1>

-Synthesis of a Hydrophilic Macro-Monomer 1-

Into 70 g of ethanol were dissolved 30 g of acrylamide and 3.8 g of 3-mercaptopropionic acid, and then the temperature of the reaction system was raised to 60° C. in nitrogen atmosphere. Thereto was added 300 mg of 2,2-azobisisobutyronitrile to continue reaction for 6 hours. After the reaction, the resultant white precipitation was filtrated off and sufficiently washed with methanol to yield 30.8 g of a carboxylic acid terminated prepolymer (acid value: 0.787 meq/g, weight average molecular weight: $1.29\times10^3$).

Into 62 g of dimethylsulfoxide was dissolved 20 g of the resultant prepolymer, and thereto were added 6.71 g of glycidyl methacrylate, 504 mg of N,N-dimethyldodecylamide (catalyst), and 62.4 g of hydroquinone (polymerization inhibitor). The solution was allowed to react at 140° C. in nitrogen atmosphere for 7 hours. The reaction solution was added to acetone to precipitate a polymer. The precipitation was sufficiently washed to yield 23.4 g of a methacrylate acrylamide terminated macro-monomer (hydrophilic macro-monomer 1) (weight average molecular weight: 1400). From methacryloyl group olefin peaks at 6.12 and 5.70 ppm on a chart from $^1$H-NMR ($D_2O$) and a reduction of the acid value (0.057 meq/g), it was proved that a polymerizable group was introduced into the terminal.

-Copolymerization of the Hydrophilic Macro-Monomer 1 and the Hydrophobic Monomer- Into a flask were put 15 g of distilled water, 6 g of ethanol, 0.8 g of the hydrophilic macro-monomer 1, 10 g of methyl methacrylate, and 0.25 g of 2,2-azobis[2-(2-imidazoline-2-yl)propane] (trade name: VA 061, manufactured by Wako Pure Chemicals, Industries) to start reaction at 65° C. in nitrogen atmosphere. After the start of the reaction, the solution became clouded. The reaction was continued as it was for 6 hours. After the end of the reaction, the resultant was subjected to ultrafiltration (fraction molecular weight: 13,000), so as to be refined. The resultant white suspension had good dispersibility. A particle size meter ELS-800 manufactured by Otsuka Electronics Co., Ltd. was used to measure the particle size thereof. As a result, it was proved that the size of the particles was about 1 μm.

<Synthesis Example of Specific Water-Dispersible Particles 2>

-Synthesis of a Hydrophilic Macro-Monomer 2-

Into 70 g of ethanol were dissolved 45 g of N-vinylpyrrolidone, and 3.8 g of 3-mercaptopropionic acid, and then the temperature of the reaction system was raised to 60° C. in nitrogen atmosphere. Thereto was added 300 mg of a thermal polymerization initiator 2,2-azobisisobutyronitrile to continue reaction for 6 hours. After the reaction, the resultant white precipitation was filtrated off and sufficiently washed with methanol to yield 45.5 g of a carboxylic acid terminated prepolymer (acid value: 0.755 meq/g, weight average molecular weight: $1.10\times10^3$).

Into 62 g of dimethylsulfoxide was dissolved 20 g of the resultant prepolymer, and thereto were added 6.71 g of glycidyl methacrylate, 504 mg of N,N-dimethyldodecylamide (catalyst), and 62.4 g of hydroquinone (polymerization inhibitor). The solution was allowed to react at 140° C. in nitrogen atmosphere for 7 hours. The reaction solution was added to acetone to precipitate a polymer. The precipitation was sufficiently washed to yield 23.4 g of a methacrylate acrylamide terminated macro-monomer (hydrophilic macro-monomer 2) (weight average molecular weight: 1400). From methacryloyl group olefin peaks at 6.12 and 5.70 ppm on a chart obtained by $^1$H-NMR ($D_2O$) and a reduction of the acid value (0.045 meq/g), it was proved that a polymerizable group was introduced into the terminal.

-Copolymerization of the Hydrophilic Macro-Monomer 2 and the Hydrophobic Monomer 2-

Into a flask were put 15 g of distilled water, 6 g of ethanol, 2.5 g of the hydrophilic macro-monomer 2, 10 g of methyl methacrylate, and 0.25 g of 2,2-azobis[2-(2-imidazoline-2-yl)propane] (trade name: VA 061, manufactured by Wako Pure Chemicals, Industries) to start reaction at 65° C. in nitrogen atmosphere. After the start of the reaction, the solution became a white suspension in approximately 30 minutes. The reaction was continued as it was for 6 hours. After the end of the reaction, the resultant was subjected to ultrafiltration (fraction molecular weight: 13,000), so as to be refined. The resultant white suspension had good dispersibility. A particle size meter ELS-800 manufactured by Otsuka Electronics Co., Ltd. was used to measure the particle size thereof. As a result, it was proved that the size of the particles was about 0.5 μm.

The mole ratio between the hydrophilic macro-monomer and the hydrophobic monomer in the copolymer thereof in the specific water-dispersible particles used in the invention is preferably from 1:50 to 1:200, more preferably from 1:80 to 1:150.

The molecular weight of the specific water-dispersible particles is preferably from 5,000 to 100,000, more preferably from 10,000 to 80,000.

The particle size of the specific water-dispersible particles is preferably from 0.15 to 1.5 μm, more preferably from 0.5 to 1.2 μm. The particle size can be controlled by reaction conditions, which is evident from known technical examples. Specifically, the particle size can be made large by the extension of the reaction time, a decrease in the adding amount of the hydrophilic macro-monomer, and other operations.

The specific water-dispersible particles according to the present embodiment may be incorporated into a hydrophilic layer forming coating-solution at the time of forming a hydrophilic layer which will be detailed below, applied onto a suitable support, and dried. The content by percentage of the specific water-dispersible particles in the hydrophilic layer forming coating-solution is preferably from 5 to 40%, more preferably from 10 to 30%.

[Hydrophilic Layer]

The type of the hydrophilic layer in the present embodiment is not particularly limited as long as the hydrophilic layer can contain the specific water-dispersible particles and exhibit a hydrophilic surface. Preferred examples thereof include a crosslinked hydrophilic layer (I) and a graft chain-introduced crosslinked hydrophilic layer (II). The graft hydrophilic layer II is more preferred. These hydrophilic layers will be successively described hereinafter.

(Crosslinked Hydrophilic Layer I)

The crosslinked hydrophilic layer used in the present embodiment may be a known hydrophilic layer. Examples of the known hydrophilic layers include organic crosslinked hydrophilic layers in which a hydrophilic polymer having a hydroxyl group, an amide group, a carboxyl group, a sulfonic acid, or a functional group made of a salt thereof is crosslinked with a crosslinking agent such as a polyfunctional isocyanate, a polyfunctional epoxy, or a polyfunctional aldehyde, as described in WO 94/23954 and JP-A No. 9-54429. Therein are described hydrophilic layers in which an optically crosslinking group is introduced into a hydrophilic polymer and then the polymer is crosslinked by light. The thus-formed hydrophilic layers can also be used.

Other examples of the crosslinked hydrophilic layer used in the present embodiment include a hydrophilic layer which is made of a crosslinked polymer and contains metal colloid, as described in WO 98/40212, and an organic/inorganic hybrid hydrophilic layer made of an organic hydrophilic polymer and a silane coupling agent, as described in Japanese Patent Gazette No. 2592225.

The above-mentioned organic crosslinked hydrophilic layer is preferably a layer having a three-dimensional crosslinked structure, and is specifically a layer as described below.

Examples of the hydrophilic polymer capable of forming the three-dimensional crosslinked structure useful for the crosslinked hydrophilic layer production include polymers which are capable of forming a network structure and comprise a polymer main chain composed of carbon-carbon bonds and a side chain containing one or more types of hydrophilic functional groups selected from the group consisting of a carboxyl group, an amino group, a phosphoric acid group, a sulfonic acid group, a salt thereof, a hydroxyl group, an amide group and a polyoxyethylene group; polymers in which carbon atoms or carbon-carbon bonds are bonded to each other through at least one type of hetero atom(s) selected from oxygen, nitrogen, sulfur and phosphorus; and polymers which are capable of forming a network structure and comprise such a main chain and a side chain which contains one or more types of hydrophilic functional groups selected from the group consisting of a carboxyl group, an amino group, a phosphoric acid group, a sulfonic acid group, a salt thereof, a hydroxyl group, an amide group and a polyoxyethylene group. Specific examples thereof include poly(meth)acrylate type, polyoxyalkylene type, polyurethane type, epoxy ring opened addition polymerization type, poly(meth)acrylic acid type, poly(meth)acrylamide type, polyester type, polyamide type, polyamine type, polyvinyl type, and polysaccharide type polymers; and polymers of combination thereof.

Among these polymers, preferred are polymers in which side chains of their segments repeatedly have any one selected from a hydroxyl group; a carboxyl group or a metal salt thereof; an amino group or a hydrogen halide salt thereof; a sulfonic acid group or an amine thereof, an alkali metal salt thereof, or an alkali earth metal salt thereof; and an amide group, or have a combination thereof. More preferred are polymers having such a hydrophilic functional group and further having, in a part of their main chain segment, a polyoxyethylene group since the polymers have higher hydrophilicity. Still more preferred are hydrophilic polymers having these groups and further having, in their main chain or side chain, a urethane bond or a urea bond, since then the polymers have not only higher hydrophilicity but also improved printing resistance in the non-image portions.

Specific examples of the hydrophilic polymer capable of forming a three-dimensional network structure include hydrophilic homopolymers and copolymers synthesized by the use of at least one selected from hydrophilic monomers having a hydrophilic group such as a hydroxyl group, a carboxyl group or a salt thereof, a sulfonic acid or a salt thereof, phosphoric acid group or a salt thereof, an amide group, an amino group and an ether group. Examples of the hydrophilic monomers include (meth)acrylic acid, and alkali or amine salts thereof; itaconic acid, and alkali or amine salts thereof; 2-hydroxyethyl (meth)acrylate; (meth)acrylamide; N-monomethylol(meth)acrylamide; N-dimethylol(meth) acrylamide; 3-vinylpropionic acid, and alkali or amine salts thereof; vinylsulfonic acid, and alkali or amine salts thereof; 2-sulfoethyl(meth)acrylate, polyoxyethylene glycol mono (meth)acrylate, 2-acrylamide-2-methylpropanesulfonic acid, acid phosphooxypolyoxyethylene glycol mono(meth) acrylate, and allylamine.

Regarding the hydrophilic polymers having therein a functional group such as a hydroxyl group, a carboxyl group, an amino group or a salt thereof, or an epoxy group, this functional group is used to yield an unsaturated group-containing polymer into which the following is introduced: a addition-polymerizable double bond such as a vinyl, allyl or (meth)acryl group; or a crosslinked structure forming group such as a cinnamoyl, cinnamilidene, cyanocinnamilidene or p-phenyldiacrylate group. If necessary, thereto are added a monofunctional or polyfunctional monomer which can be copolymerized with the unsaturated group and also functions as a crosslinking agent, a polymerization initiator which will be described below, and other additives, which will be detailed later, and then the mixture is dissolved in a suitable solvent to prepare a hydrophilic layer forming coating-solution.

The radical initiator added when the above-mentioned hydrophilic layer forming coating-solution is prepared is preferably an azo type radical initiator or an organic peroxide, and is more preferably an azo type radical initiator. Specific examples of the preferred azo type radical initiator are the same as described in the first embodiment. Thus, description thereof is omitted herein.

The adding amount of the radical initiator is preferably from 0.001 to 20 parts, more preferably from 0.1 to 10 parts, and most preferably from 0.1 to 5 parts by mass per 100 parts by mass of the unsaturated group-containing polymer and the optional monofunctional or polyfunctional monomer.

In the present embodiment, the thus-prepared hydrophilic layer forming coating-solution is mixed with the specific water-dispersible particles, and then the mixture is applied onto a support, which will be detailed later, and dried to form a three-dimensional crosslinked structure.

The amount of the applied hydrophilic layer forming coating-solution after being dried is from 0.5 to 3.0 g/m$^2$, more preferably from 0.8 to 2.0 g/m$^2$.

The above-mentioned hydrophilic polymer having an active hydrogen, such as a hydrogen in a hydroxyl, amino or carboxyl group, together with an isocyanate compound or block polyisocyanate compound and optional other components, is added to the hydrophilic layer forming coating-solution, and the coating-solution is applied onto a support. The coating-solution is dried. Subsequently or at the same time of the drying, the components in the coating-solution are caused to be reacted with each other so as to produce a three-dimensional crosslinked structure. As a component copolymerizable with the hydrophilic polymer, there can be used a monomer having a glycidyl group, such as glycidyl (meth)acrylate, or a monomer having a carboxyl group, such as (meth)acrylic acid. The hydrophilic polymer having a glycidyl group can be three-dimensionally crosslinked by ring opening reaction with a crosslinking agent as follows: an α, ω-alkane or alkenedicarboxylic acid such as 1,2-ethanedicarboxylic acid or adipic acid; a polycarboxylic acid such as 1,2,3-propanetricarboxylic acid or trimellitic acid; a polyamine compound such as 1,2-ethanediamine, diethylenediamine, diethylenetriamine or α, ω-bis-(3-aminopropyl)-polyethylene glycol ether; an oligoalkylene or polyalkylene glycol such as ethylene glycol, propylene glycol, diethylene glycol or tetraethylene glycol; or a polyhydroxl compound such as trimethylol propane, glycerin, pentaerythritol or sorbitol.

The hydrophilic polymer having a carboxyl or amino group can be three-dimensionally crosslinked by epoxy ring opening reaction or some other reaction with a crosslinking agent as follows: a polyepoxy compound such as ethylene or propylene glycol diglycidyl ether, polyethylene or polypropylene glycol diglycidyl ether, neopentyl glycol diglycidyl ether, 1,6-hexanediol diglycidyl ether or trimethylol propane triglycidyl ether.

Other examples of the crosslinking agent used to crosslink the hydrophilic polymer three-dimensionally include amino compounds having at least two functional groups selected from the group consisting of methylol groups, alkoxymethyl groups, in which methylol groups are alcohol-condensed/modified, acetoxymethyl groups, or other groups. More specific examples thereof include melamine derivatives, for example, methoxymethylated melamines [Cymel 300 series (1) etc., manufactured by Mitsui Cyanamide Co.], benzoguanamine derivatives [methyl/ethyl mixed alkoxylated benzoguanamine resins (Cymel 1100 series (2) etc., manufactured by Mitsui Cyanamide Co.)], and glycoluril derivatives [tetramethylol glycoluril resins (Cymel 1100 series (3) etc., manufactured by Mitsui Cyanamide Co.)], urea resin derivatives and a resol resin.

When the hydrophilic polymer is a polysaccharide (such as a cellulose derivative), polyvinyl alcohol, a partially-saponificated product thereof, a glycidol homopolymer or copolymer, or a hydrophilic polymer based thereon, the hydroxyl group contained therein is used and the above-mentioned functional group which can be crosslinked is introduced so as to produce a three dimensional crosslinked structure by the above-mentioned method.

Among the above-mentioned polymers, preferred are the following hydrophilic polymers which are crosslinked three-dimensionally by the above-mentioned method: hydrophilic homopolymer or copolymers synthesized using at least one selected from hydrophilic monomers having a hydrophilic group (such as a carboxyl group, a sulfonic acid group, a phosphoric acid group, an amino group, a salt thereof, a hydroxyl group, an amide group, or an ether group), specific examples of the hydrophilic monomer including (meth) acrylic acid or alkali metal salts and amine salts thereof, itaconic acid or alkali metal salts and amine salts thereof, 2-hydroxyethyl (meth)acrylate, (meth)acrylamide, N-monomethylol(meth)acrylamide, N-dimethylol(meth) acrylamide, allylamine or halide acid salts thereof, 3-vinyl propionic acid or alkali metal salts and amine salts thereof, vinylsulfonic acid or alkali metal salts and amine salts thereof, 2-sulfoethylene (meth)acrylate, polyoxyethylene glycol mono(meth)acrylate, 2-acrylamide-2-methylpropanesulfonic acid, acid phosphooxypolyoxyethylene glycol mono(meth)acrylate, and allylamine or halide acid salts thereof; and or hydrophilic polymers made of polyoxymethylene glycol or polyoxyethylene glycol.

(Graft Chain-Introduced Crosslinked Hydrophilic Layer II)

The graft chain-introduced crosslinked hydrophilic layer II used in the invention, which may be hereinafter referred to as the "graft hydrophilic layer" according to circumstances, include, as examples thereof, any layer provided on a support by coating or coating and crosslinking, a polymer in which a hydrophilic graft polymer chain is bonded to a trunk polymer compound or a polymer in which a hydrophilic graft polymer chain is bonded to a trunk polymer compound and further a crosslinkable functional group is introduced; and any layer provided on a surface of a support by coating or coating and crosslinking a composition comprising both a hydrophilic polymer having, at its terminal, a crosslinking group and a crosslinking agent on the support surface.

The graft hydrophilic layer according to the present embodiment can be produced by preparing a graft polymer by a method that is generally known as a graft polymer synthesizing method, and then crosslinking the graft polymer. Specifically, the synthesis of graft polymers is described in, for example, "Graft Polymerization and Application thereof", written by Fumio IDE and published by Koubunshi Kankoukai in 1977, and "New Polymer Experiments 2, Synthesis and Reaction of Polymer", edited by the Society of Polymer Science, Japan and published by Kyoritsu Shuppan Co., Ltd. in 1995.

The synthesis of graft polymers can be classified into the following three methods: method 1 of polymerizing branch monomers from a trunk polymer, method 2 of bonding a branch polymer to a trunk polymer, and method 3 of copolymerizing a branch polymer with a trunk polymer (macromer method). The hydrophilic surface in the invention can be produced by any one of these three methods. The macromer method 3 is particularly good from the viewpoints of the easiness of polymer production and the control of film structure. The synthesis of graft polymers by the use of macromers is described in, for example, "New Polymer Experiments 2, Synthesis and Reaction of Polymer", edited by the Society of Polymer Science, Japan and published by Kyoritsu Shuppan Co., Ltd. in 1995 and "Chemistry and Industries of Macro Monomers" written by Yuya YAMASHITA in and published by IPC in 1989.

Specifically, a hydrophilic macromer can be synthesized according to the methods described in the publications using the hydrophilic monomer which is specifically described as the starting material of the above-mentioned organic crosslinked hydrophilic layer, for example, acrylic acid, acrylamide, 2-acrylamide-2-methylpropanesulfonic acid and N-vinylacetoamide.

Particularly useful hydrophilic macromers used in the formation of the graft hydrophilic layer are macromers derived from monomers having a carboxyl group such as acrylic acid and methacrylic acid; sulfonic acid based macromers derived from 2-acrylamide-2-methylpropanesulfonic acid, styrenesulfonic acid, and monomers of salts thereof; amide-based macromers such as acrylamide and methacrylamide; amide-based macromers derived from N-vinylcarboxylic amide monomers such as N-vinylacetoamide and N-vinylformamide; macromers derived from hydroxyl group containing monomers such as hydroxyethyl methacrylate, and hydroxyethyl acrylate and glycerol monomethacrylate; and macromers derived from alkoxy group- or ethylene oxide group-containing monomers such as methoxyethyl acrylate, methoxypolyethylene glycol acrylate and polyethylene glycol acrylate. As the macromer used in the invention, monomers having a polyethylene glycol chain or a polypropylene glycol chain can also be advantageously used.

The molecular weight of these macromers is preferably from 400 to 100000, more preferably from 1000 to 50000, and most preferably from 1500 to 20000. If the molecular weight is 400 or less, the advantageous effect cannot be exhibited. If the molecular weight is 100000 or more, the polymerizability with the copolymerizing monomer which will form a main chain becomes poor.

One of methods for producing a crosslinked hydrophilic layer into which a hydrophilic graft chain is introduced after the synthesis of the hydrophilic macromer is a method of copolymerizing the above-mentioned hydrophilic macromer and a different monomer having a reactive functional group, to synthesize a graft copolymer, applying the synthesized graft copolymer and a crosslinking agent which reacts with the reactive functional group of the polymer onto a support, and causing them to be reacted with each other and be crosslinked by heat. Another method is a method of synthesizing a graft polymer having the hydrophilic macromer and a photo-crosslinking or polymerizing group, applying the polymer onto a support, and causing them to react and be crosslinked by irradiation with light. In this case, the above-mentioned specific water-dispersible particles are incorporated into a hydrophilic layer forming coating-solution, so as to be deposited on the support.

As described above, the graft hydrophilic layer according to the second aspect of the invention can be formed on the support. The film thickness of the hydrophilic layer, which can be selected dependently on purpose, is preferably from 0.001 to 10 μm, more preferably from 0.01 to 5 μm, and most preferably from 0.01 to 1 μm. If the film thickness is too thin, the scratch resistance trends to lower. If the film thickness is too thick, the effect of improving the adhesiveness to the support trends to lower.

In the present embodiment, it is unnecessary to cover the support surface with the graft polymer completely even when a transparent resin substrate is used as the support. In a case that the graft polymer is introduced to such a support surface, effective adhesion-improving effect is exhibited if the graft polymer is introduced in a proportion of 10% or more of the entire surface area of the support. The proportion of the graft polymer in the entire surface area of the support is more preferably 30% or more, still more preferably 60% or more.

Among such graft hydrophilic layers, a hydrophilic layer having a hydrophilic graft chain and having a crosslinked structure formed by hydrolyzing and polycondensing an alkoxide compound containing an element selected from Si, Ti, Zr and Al is preferable from the viewpoints of the close adhesison thereof to the support and the strength of the film. The hydrophilic layer having such a crosslinked structure can be appropriately formed, using the alkoxide compound and a compound having a hydrophilic functional group capable of forming a hydrophilic graft chain. Among the alkoxide compounds, alkoxides of Si are preferred from the viewpoints of the reactivity and easy availability thereof. Specifically, compounds as silane coupling agents can be preferably used.

The crosslinked structure formed by hydrolyzing and polycondensing the alkoxide compound is referred to as the sol-gel crosslinked structure according to circumstances in the invention.

The hydrophilic layer having the hydrophilic graft chain in a free form and the sol-gel crosslinked structure can easily be formed by preparing a hydrophilic layer forming coating-solution which preferably contains a hydrophilic polymer represented by the following general formula (1) and more preferably contains a crosslinking component represented by the following general formula (2), applying the coating-solution to a surface of a support, and drying the applied solution.

General formula (1)

(i)

(ii)

(iii)

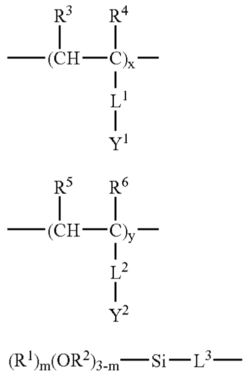

$$(R^7)_m\text{—}X\text{—}(OR^8)_{4-m} \quad \text{General Formula (2)}$$

In the present embodiment, respective members other than the hydrophilic layer, the method for forming the hydrophilic layer, and other features are basically the same as in the first embodiment. Thus, description thereon is omitted.

Since the planographic printing plate precursor of the present embodiment has a hydrophilic layer superior in endurance and hydrophilicity and can form image portions (hydrophobic areas) superior in close adhesion to the hydrophilic layer, the precursor can give a great number of high image quality printed matters, in which non-image portions are not stained, and is superior in printing resistance.

EXAMPLES

Hereinafter, the present invention will be described in detail by way of the following examples. However, the invention is not limited to these examples.

Example 1

(Formation of a Support)

An aluminum plate (material quality 1050) having a thickness of 0.30 mm was washed with trichloroethylene, so as to be degreased. Thereafter, a nylon brush and a suspension of a 400 mesh pumice in water were used to roughen the surface thereof. Thereafter, the plate was sufficiently washed with water. This plate was immersed in a 25% by mass solution of sodium hydroxide in water at 45° C. for 9 seconds so as to be etched. The plate was washed with water, immersed in 2% by mass nitric acid for 20 seconds, and washed with water. At this time, the etched amount of the roughened surface was about 3 g/$m^2$.

Next, this plate was subjected to anodizing treatment using 7% by mass sulfuric acid as an electrolyte at a current density of 15 A/$dm^2$, so as to form a direct current anodic oxide film in such a manner that the thickness of the film would be 2.4 g/$m^2$. Thereafter, the plate was washed with water to yield a support.

(Formation of a Hydrophilic Layer)

The following components were mixed into a homogeneous form, and the mixture was stirred at room temperature for 2 hours to be hydrolyzed. In this way, a hydrophilic layer forming coating-solution 1 in a sol form was obtained.

<Hydrophilic Layer Forming Coating-Solution 1>

| | |
|---|---|
| the above-exemplified specific hydrophilic polymer (1-1) | 21 g |
| tetramethoxysilane [crosslinking component] | 62 g |
| ethanol | 470 g |
| water | 470 g |
| aqueous nitric acid solution (1 N) | 10 g |

Thereafter, the following composition 1 having image-forming ability was mixed with the hydrophilic layer forming coating-solution 1, and then the mixture was applied to the aluminum support in such a manner that the amount of the applied solution after being dried would be 3 g/$m^2$. The support was heated and dried at 100° C. for 10 minutes to yield a planographic printing plate precursor 1.

<Composition 1 Having Image-Forming Ability>

| | |
|---|---|
| the above-mentioned hydrophilic layer forming coating-solution | 660 g |
| the specific water-dispersible particles 1 described in the Synthesis Example (10% by mass) | 200 g |
| infrared ray absorbing dye I (the following compound) | 5 g |

Infrared Ray Absorbing Dye I

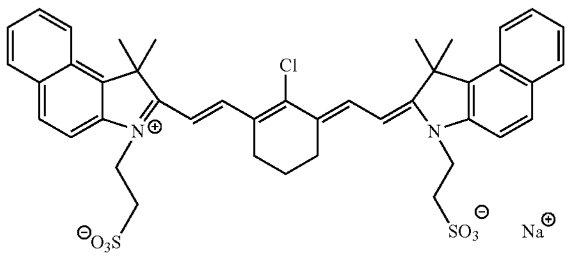

[Evaluation]

(Evaluation of Hydrophilicity/Hydrophobicity)

The contact angle (of a water droplet in the air) with respect to the resultant planographic printing plate precursor 1 was measured with a meter CA-Z manufactured by Kyowa Interface Science Co., Ltd. As a result, the contact angle was 7.7°. Thus, it was proved that the planographic printing plate precursor 1 exhibited excellent hydrophilicity.

Next, this planographic printing plate precursor 1 was imagewise exposed to a laser from a Trend setter 3244 VFS manufactured by Kureo, on which a water-cooling type 40 W infrared ray semiconductor laser device was mounted, under the following conditions: an outside surface drum rotation number of 100 rpm, a printing plate energy of 200 mJ/$cm^2$, and a resolution of 2400 dpi. In the exposed areas, the water droplet contact angle was measured in the same way as described above.

The water droplet contact angle in the exposed areas was 110°, and the exposed areas were made hydrophobic, so as to demonstrate that image portions (ink-receiving areas) had been formed.

(Evaluation of Printability)

The imagewise-exposed planographic printing plate precursor 1 was set onto the following printer without being developed. The precursor 1 is then used for printing.

The used printer was a printer SOR-M manufactured by Heidelberg Co. As moistening water, an IF 201 (2.5%) or IF 202 (0.75%), manufactured by Fuji Photo Film Co., Ltd., was used. As ink, a GEOS sumi (trade name, manufactured by Dainippon Ink and Chemicals, Incorporated) was used. At the initial stage of the printing process, high-quality printed matters were immediately obtained. Thereafter, the printing was continued. As a result, even when a 30,000$^{th}$ printed matter was formed, the printed matter was a good printed matter in which the image portions thereof were not faint or patchy. Thus, it was proved that the planographic printing plate precursor 1 was superior in printing resistance.

Example 2

(Formation of a Hydrophilic Layer)

The following components were mixed into a homogeneous form, and the mixture was stirred at room temperature for 2 hours to be hydrolyzed. In this way, a hydrophilic layer forming coating-solution 2 in a sol form was obtained.

<Hydrophilic Layer Forming Coating-Solution 2>

| | |
|---|---|
| the above-exemplified specific hydrophilic polymer (1-15) | 21 g |
| tetramethoxysilane [crosslinking component] | 62 g |
| ethanol | 470 g |
| water | 470 g |
| aqueous nitric acid solution (1 N) | 10 g |

Thereafter, the following composition 2 having image-forming ability was mixed with the hydrophilic layer forming coating-solution 2, and then the mixture was applied to a corona-treated polyethylene terephthalate film in such a manner that the amount of the applied solution after being dried would be 3 g/m$^2$. The support was heated and dried at 100° C. for 10 minutes to yield a planographic printing plate precursor 2.

<Composition 2 Having Image-Forming Ability>

| | |
|---|---|
| the above-mentioned hydrophilic layer forming coating-solution 2 | 660 g |
| the specific water-dispersible particles 2 described in the Synthesis Example (10% by mass) | 200 g |
| infrared ray absorbing dye I (described in Example 1) | 5 g |

[Evaluation]

(Evaluation of Hydrophilicity/Hydrophobicity)

The contact angle (of a water droplet in the air) with respect to the resultant planographic printing plate precursor 2 was measured with a meter CA-Z manufactured by Kyowa Interface Science Co., Ltd. As a result, the contact angle is 6.5°. Thus, it is proved that the planographic printing plate precursor 2 exhibited excellent hydrophilicity.

Next, this planographic printing plate precursor 2 was imagewise exposed to a laser from a Trend setter 3244 VFS manufactured by Kureo, on which a water-cooling type 40 W infrared semiconductor laser device was mounted, under the following conditions: an outside surface drum rotation number of 100 rpm, a printing plate energy of 200 mJ/cm$^2$, and a resolution of 2400 dpi. In the exposed areas, the water droplet contact angle was measured in the same way as described above.

The water droplet contact angle in the exposed areas was 102°, that is, the exposed areas were made hydrophobic, so as to demonstrate that image portions (ink-receiving areas) had been formed.

(Evaluation of Printability)

The imagewise-exposed planographic printing plate precursor 2 was set onto the following printer without being developed. The precursor 2 was then used for printing.

The used printer was a printer SOR-M manufactured by Heidelberg Co. As moistening water, an IF 201 (2.5%) or IF 202 (0.75%), manufactured by Fuji Photo Film Co., Ltd. was used. As ink, a GEOS sumi (trade name, manufactured by Dainippon Ink and Chemicals, Incorporated) was used. At the initial stage of the printing process, high-quality printed matters were immediately obtained. Thereafter, the printing was continued. As a result, even when a 30,000$^{th}$ printed matter was formed, the printed matter was a printed matter of good quality in which the image portions were not faint or patchy. Thus, it was proved that the planographic printing plate precursor 2 was superior in printing resistance.

As described above, according to the planographic printing plate precursor of the invention, it is possible to keep high hydrophilicity even under harsh printing conditions, achieve high printing resistance, and obtain a great number of printed matters in which non-image portions are not stained. Furthermore, produced are advantageous effects that printing plates can be made by scanning-exposure based on digital signals; and printing plates can be made by easy water-developing treatment, or the precursor is set onto a printer without being developed, so as to make it possible to perform printing.

What is claimed is:

1. A planographic printing plate precursor comprising:

a support; and a hydrophilic layer disposed on or over the support and including a hydrophilic graft chain and a crosslinked structure formed by at least one of hydrolyzing or polycondensing an alkoxide of an element selected from Si, Ti, Zr and Al, wherein the hydrophilic layer includes a photothermal conversion agent (A) and a compound (B) comprising water-dispersible particles capable of forming a hydrophobic surface area by being at least one of heated or irradiated with radiation and which are made of a hydrophobic polymer having a structural unit including an organic silicon group represented by the following formula (6):

Formula (6)

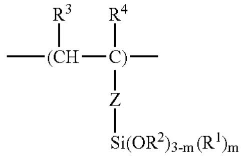

wherein $R^1$, $R^2$, $R^3$ and $R^4$ each independently represent a hydrogen atom or a hydrocarbon group having 1 to 8 carbon atoms, m is 0, 1 or 2, Z represents a group selected from the following:

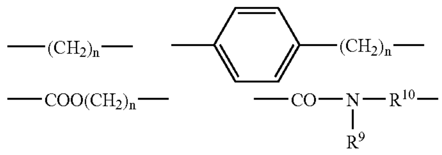

wherein $R^9$ represents a hydrocarbon group having 1 to 8 carbon atoms, $R^{10}$ represents an alkylene group having 5 or less carbon atoms, or a bivalent organic residue in which a plurality of chain-like carbon atom groups are bonded to each other through a carbon atom or a nitrogen atom, and n is an integer of 0 to 4, and the photothermal conversion agent (A) is not present in a manner integral with the compound (B), which would result from adding the agent (A) to the compound (B) when the compound (B) is produced, but is present in a manner independent of the compound (B) and dispersed in the hydrophilic layer.

2. The planographic printing plate precursor according to claim 1, wherein the hydrophilic layer comprises a hydrophilic polymer compound which includes a polymer unit represented by the following structural unit (i) and optionally a polymer unit represented by the following structural unit (ii) of the following formula (1), the hydrophilic polymer compound further including a silane coupling group represented by the following structural unit (iii) of the following formula (1) at a terminal of the polymer unit:

Formula (1)

(i)

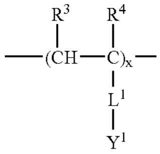

(ii)

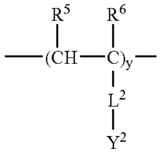

(iii)

$$(R^1)_m(OR^2)_{3-m}—Si—L^3—$$

wherein $R^1$, $R^2$, $R^3$, $R^4$, $R^5$ and $R^6$ each independently represent a hydrogen atom or a hydrocarbon group having 1 to 8 carbon atoms, m is 0, 1 or 2, x and y are values satisfying x+y=100 and the ratio of x:y is in a range from 100:0 to 1:99, $L^1$, $L^2$ and $L^3$ each independently represent a single bond or an organic linking group, and $Y^1$ and $Y^2$ each independently represent $—N(R^7)(R^8)$, —OH, $—NHCOR^7$, $—COR^7$, $—CO_2M$ or $—SO_3M$ wherein $R^7$ and $R^8$ each independently represent a hydrogen atom or an alkyl group having 1 to 8 carbon atoms and M represents a hydrogen atom, alkali metal, alkali earth metal or onium.

3. The planographic printing plate precursor according to claim 2, wherein the hydrophilic layer is formed by: applying, to a surface of the support, a hydrophilic coating-solution composition comprising the hydrophilic polymer compound represented by the formula (1) and a crosslinking component represented by the following formula (2); and then drying the composition:

$$(R^7)_m—X—(OR^8)_{4-m} \qquad \text{Formula (2)}$$

wherein $R^7$ and $R^8$ each independently represents an alkyl group or an aryl group, and X represents Si, Al, Ti or Zr, and m is an integer from 0 to 2.

4. The planographic printing plate precursor according to claim 3, wherein the crosslinking compound represented by the formula (2) has a polymerizable functional group in a structure thereof and is polycondensed with the hydrophilic polymer compound via the functional group, thereby forming a strong coating film having a crosslinked structure.

5. The planographic printing plate precursor according to claim 3, wherein in the hydrophilic coating-solution composition, the ratio of the crosslinking component is at least 5% by mole with respect to the silane coupling group in the hydrophilic polymer compound.

6. The planographic printing plate precursor according to claim 2, wherein the hydrophilic polymer compound is synthesized by using an unsaturated compound represented by at least one of the following formulae (3) or (4) and a silane compound having a mercapto group and represented by the formula (5), so as to be radical-polymerized:

(3)

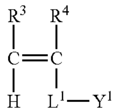

(4)

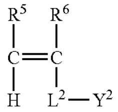

(5)

$$(R^1)_m(OR^2)_{3-m}—Si—L^3—S—H$$

wherein $R^1$ to $R^6$, $L^1$, $L^2$, $L^3$; $Y^1$, $Y^2$ and m are defined as in formula (1).

7. The planographic printing plate precursor according to claim 6, wherein the amount of a radical initiator added at the time of the radical polymerization is from 0.001 to 20 parts by weight with respect to 100 parts by weight of a total amount of the unsaturated compound represented by at least one of the formulae (3) or (4) and the silane compound having the mercapto group and represented by the formula (5).

8. The planographic printing plate precursor according to claim 7, wherein the radical initiator is one of an azo type radical initiator or an organic peroxide.

9. The planographic printing plate precursor according to claim 1, wherein a surface of the hydrophobic polymer is hydrophilic.

10. The planographic printing plate precursor according to claim 1, wherein a water-soluble surface protective layer, including a water-soluble polymer as a main component is disposed on the hydrophilic layer.

11. The planographic printing plate precursor according to claim 1, wherein the compound (B) comprises water-dispersible particles obtained by copolymerizing a hydrophilic macro-monomer and a hydrophobic monomer.

12. The planographic printing plate precursor according to claim 11, wherein the water-dispersible particles comprise radial core-corona type fine particles, in which chains of the hydrophilic macro-monomer are bonded to each other, in a radiant form, to form an outer side of the particles; and the hydrophobic monomer is polymerized to form nuclei at the inner side of the particle.

13. The planographic printing plate precursor according to claim 11, wherein a mole ratio between the hydrophilic macro-monomer and the hydrophobic monomer in the water-dispersible particles, which is the copolymer of the hydrophilic macro-monomer and the hydrophobic monomer, is from 1:50 to 1:200.

14. The planographic printing plate precursor according to claim 11, wherein a molecular weight of the water-dispersible particles ranges from 5,000 to 100,000.

15. The planographic printing plate precursor according to claim 11, wherein a particle size of the water-dispersible particles ranges from 0.15 to 1.5 μm.

* * * * *